United States Patent
Horikawa et al.

(10) Patent No.: US 9,166,360 B2
(45) Date of Patent: Oct. 20, 2015

(54) LASER LIGHT SOURCE APPARATUS

(71) Applicant: USHIO DENKI KABUSHIKI KAISHA, Tokyo (JP)

(72) Inventors: Yoshihiro Horikawa, Hyogo (JP); Takayuki Kozakura, Hyogo (JP); Tetsuya Ozawa, Hyogo (JP); Toru Nishikubo, Hyogo (JP); Takanori Samejima, Hyogo (JP); Kazuhiro Yoshida, Hyogo (JP)

(73) Assignee: USHIO DENKI KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/220,117

(22) Filed: Mar. 19, 2014

(65) Prior Publication Data
US 2014/0285872 A1 Sep. 25, 2014

(30) Foreign Application Priority Data

Mar. 21, 2013 (JP) ................. 2013-058160
Mar. 21, 2013 (JP) ................. 2013-058161

(51) Int. Cl.
| | |
|---|---|
| H01S 5/00 | (2006.01) |
| H01S 3/109 | (2006.01) |
| H01S 5/14 | (2006.01) |
| G02F 1/35 | (2006.01) |
| H01S 5/022 | (2006.01) |
| H01S 5/024 | (2006.01) |
| H01S 5/062 | (2006.01) |

(52) U.S. Cl.
CPC ............. *H01S 3/109* (2013.01); *G02F 1/353* (2013.01); *H01S 5/02296* (2013.01); *H01S 5/141* (2013.01); *G02F 2203/60* (2013.01); *H01S 5/005* (2013.01); *H01S 5/02208* (2013.01); *H01S 5/02446* (2013.01); *H01S 5/06216* (2013.01)

(58) Field of Classification Search
CPC ....... G02F 1/37; H01S 3/1028; H01S 5/0092; H01S 5/0607; H01S 5/0612; H01S 5/0261
USPC .............................. 359/326–332; 372/21–22
See application file for complete search history.

(56) References Cited

U.S. PATENT DOCUMENTS

| | | | | |
|---|---|---|---|---|
| 7,841,746 | B2 | 11/2010 | Kamijima | |
| 7,855,830 | B2 * | 12/2010 | Inoue et al. | 359/326 |
| 2011/0147566 | A1 * | 6/2011 | Furuya et al. | 250/205 |
| 2014/0233090 | A1 * | 8/2014 | Sugihara et al. | 359/328 |

FOREIGN PATENT DOCUMENTS

JP 2009-054446 A 3/2009

* cited by examiner

*Primary Examiner* — Daniel Petkovsek

(57) ABSTRACT

The fundamental wave light emitted from a semiconductor laser is converted in wavelength by a wavelength conversion element and emitted therefrom. A lighting circuit lights the semiconductor laser, and a temperature control unit 21b controls the amount of electric power supply to a heater so that the temperature of the wavelength conversion element turns into temperature at which the wavelength conversion efficiency thereof becomes optimal. When a state where the amount of electric power supply of the heater is lower limit or below continues for a predetermined period or longer, the hang-up suppressing unit 21c, or when duration time in a state where the temperature of the wavelength conversion element is higher than the control target temperature becomes higher than a constant value, laser lighting current is decreased by a preset amount, thereby recovery from a high temperature hang-up state performed.

9 Claims, 17 Drawing Sheets (a) Controlable time (b) High temperature hang-up time

LASER LIGHT SOURCE APPARATUS

CROSS-REFERENCES TO RELATED APPLICATION

This application claims priority from Japanese Patent Application Serial Nos. 2013-058160 and 2013-058161 filed Mar. 21, 2013 respectively, the contents of which are incorporated herein by reference in their entireties.

TECHNICAL FIELD

The present invention relates to a wavelength conversion type laser light source apparatus which uses a nonlinear optical crystal. More particularly, the present invention relates to a laser light source apparatus having a feature in a temperature control method for carrying out temperature control so that the conversion efficiency of the nonlinear optical crystal in the wavelength conversion type laser light source apparatus may be maximized.

BACKGROUND

Apparatuses using laser light as a light source of a projection type projector, which is used for a movie or home theater, have been developed. In such a laser light source which serves as a light source, there are case where light emitted directly from a semiconductor laser element is used, and case where the wavelength of light emitted from the semiconductor laser element is converted to wavelength different therefrom by a nonlinear optical crystal in order to use the light. In recent years, laser light sources have been developed as blue or green laser light sources in which periodically poled lithium niobate (PPLN: Periodically Poled Lithium Niobate), or periodically poled lithium tantalate (PPLT: Periodically Poled Lithium Tantalate), etc. is used for such a nonlinear optical crystal.

For example, what is disclosed in Japanese Patent Application Publication No. 2009-54446 is known as such technology. The Japanese Patent Application Publication discloses that a laser light source apparatus comprises a light source, which is made up of a semiconductor laser; a wavelength conversion element (which is a nonlinear optical crystal, for example, PPLN) which receives and converts laser light emitted from the light source, into second harmonics; and an external resonator which chooses light of predetermined wavelength emitted from the wavelength conversion element, and which reflects it toward the light source (for example, volume bragg grating: VBG: Volume Bragg Grating). Moreover, it discloses that a temperature adjusting unit is provided between the wavelength conversion element and a subbase to which the wavelength conversion element is attached. Furthermore, it discloses that since a pitch of a polarization reversal cycle of the wavelength conversion element can be adjusted by adjusting the temperature of the wavelength conversion element using the temperature adjusting unit, it becomes possible to improve the light conversion efficiency.

FIG. 14 is a block diagram showing a schematic configuration of a laser light source apparatus. A wavelength conversion element 5 (for example, PPLN) mounted on a laser light source unit LH has a function to perform wavelength conversion for converting the wavelength of light emitted from the laser light source element 2 (which is, for example, a semiconductor laser, and which will be referred to as a semiconductor laser) into wavelength shorter than that of the incidence light, wherein, for example, infrared rays can be converted into green light. A lightning circuit 20 comprises an electric power supply circuit U1 and a pulse circuits U2 which supplies pulse-like electric power, wherein voltage/current for lighting the semiconductor laser 2 is outputted. In this wavelength conversion element 5, quasi phase matching is carried out so as to raise the optical conversion efficiency, by raising it to predetermined temperature, so that very accurate temperature control is needed. Therefore, a heating unit 7 (hereafter explained as a heater 7) for heating the wavelength conversion element 5 is provided, and a temperature detection unit Th1 which detects the temperature of the heater 7, for example, a thermistor, is arranged.

Moreover, a control unit 21 comprises a control means 21a, a temperature control unit 21b, and a drive circuit U3 which drives the heater 7. The electric power supply circuit U1 performs control so that voltage impressed to the semiconductor laser 2 and current to be passed therethrough may be a preset value or a value set up from the outside, by the control means 21a of the control unit 21. Moreover, start or stop of the electric power supply etc. is controlled thereby. The control means 21a of the control unit 21 and the temperature control unit 21b are configured by an arithmetic processing unit (a CPU or a microprocessor). Moreover, the pulse circuit U2 is controlled by the control means 21a. The control means 21a turns on and off a switching element of the pulse circuit U2, and generates a pulse output which drives the semiconductor laser 2. The temperature control unit 21b controls the amount of electric power supplied to the heater 7 based on a difference between the temperature detected by the temperature detection unit Th1 and the preset temperature, which is target temperature, thereby performing feedback control so that the temperature of the wavelength conversion element may conform the setting temperature.

A control system, which is generally known as "ON/OFF-PID control" can be used" as the above-described feedback control system. The PID control is a method for performing control so that a proportionality element, an integration element, and a differentiation element are combined with one another, so as to become a target temperature. In addition, for example, a value of approximately several kilohertz is adopted as the frequency of a PWM output used in the present embodiments.

FIG. 15 is a flow chart showing an example of control and processing in the temperature control unit 21b of the control unit 21. The flow chart shown in FIG. 15 can be realized by software process in a microcomputer mounted in the above-described control unit 21. The temperature control unit 21b of the control unit 21 performs, for example, processing shown in the flow chart, so that the temperature of the wavelength conversion element 5 may be controlled so as to turn into the preset temperature. In order that the temperature control unit 21b of the control unit 21 controls the temperature of the wavelength conversion element 5 so as to turn into target temperature, the temperature detection unit Th1 detects the temperature of the wavelength conversion element 5, and an output manipulating value to the heater 7 is periodically put in execution and is controlled by comparing the detected temperature with the preset temperature which will serve as the target temperature. With respect thereto, a typical technique, which is PI control, where proportionality element and integration element are combined with each other, will be explained below as an example.

In FIG. 15, heater control starts at Step (B01). First, in Step (B02), a value of the temperature of the wavelength conversion element 5 (PPLN actually measured temperature value), is actually measured by the temperature detection unit Th1, whereby the actually measured temperature (Tm_PPLN) is obtained. Next, in Step (B03), target temperature of the wavelength conversion element 5, i.e. a temperature setting value (PPLN temperature setting value) of the wavelength conversion element 5 is read out, so that an optimal temperature setting value (Ts_PPLN) is obtained. And in Step (B04), the temperature setting value (Ts_PPLN) and the actually measured temperature value (Tm_PPLN) measured by the temperature detection unit Th1 are compared with each other, thereby a difference (en) therebetween is obtained. In Step (B05), a PI operation is performed using this difference (en). In this PI operation, the amount of electric power supplied to the heater 7, i.e., a manipulating value to the heater 7, is calculated from expression (1) shown below.

$$MV_n = MV_{n-1} + Kp \times e_n + Ki \times e_{n-1} \quad (1)$$

Here, $MV_n$, $MV_{n-1}$, $e_n$, and $e_{n-1}$ respectively represent this time manipulating value, last cycle manipulating value, a temperature difference value which is calculated this time, and a temperature difference value which is calculated in last cycle, and Kp and Ki are constants.

Although the manipulating value ($MV_n$) computed by the PI operation will be updated as an ON width of a PWM signal sent out from the control unit 21, when the manipulating value ($MV_n$) exceeds the maximum ($MV_n$ upper limit) in Step (B06), the maximum value is treated as the manipulating value ($MV_n$), and when it is less than the minimum ($MV_n$ lower limit) in Step (B07), the minimum value is treated as the manipulating value ($MV_n$), whereby upper and lower limit restrictions are performed (Step (B08), and Step (B09)). And in the Steps (B06-B9), the manipulating value, which is finally determined, is updated as an ON width (Duty (n)) of the PWM signal to be sent out from the control unit 21, and the heater control of that cycle ends (Steps (B10, B11)). A series of the operations from Step (B01) to Step (B11) is repeated in a predetermined cycle. The control is stably performed so that the wavelength conversion element 5 becomes optimal in temperature, by performing this flow chart periodically so as to perform feedback control. Although the PI control method which is made up of proportional control and an integration element is used in the above-explained control algorithm, other feedback control methods including, for example, control such as the PID control where a differentiation (differentiation) element is added, may be used.

In addition, as for the wavelength conversion element 5 (for example, PPLN), the conversion efficiency of laser light changes with the temperature of the wavelength conversion element, and there is the optimal temperature at which the optical conversion efficiency can be maximized. For this reason, as for the above-mentioned temperature control unit 21b, it is common that the heater 7 is controlled so that the temperature of the wavelength conversion element 5 detected by temperature detection unit Th1 may become temperature at which the above-mentioned optical conversion efficiency is maximized, in order to control that temperature.

SUMMARY

As mentioned above, in a laser light source apparatus using such a wavelength conversion element 5 (for example, PPLN), since the conversion efficiency of laser light changes with the temperature of this PPLN, it is necessary to set up the optimal temperature by a heater circuit etc., while monitoring the temperature of the wavelength conversion element 5. FIG. 16 is a diagram showing the relation between the preset temperature of the wavelength conversion element and the amount of heat added to the wavelength conversion element. The horizontal axis of each graph shows the preset temperature at time feedback control of the temperature of the wavelength conversion element is carried out. A line A shows the heating amount (also referred to as IR radiation heat amount) to the wavelength conversion element heated due to radiant heat at time when the wavelength conversion element is irradiated with fundamental wave light from the laser light source. A line B shows the amount of heating (the amount of electric power supply to the heater 7) by the heater 7, and a line C shows the total heat which is a sum of them. In addition, the graph (a) of the figure shows case where the laser light source apparatus is not in a high temperature hang-up state, which will be described below, and the graph (b) thereof shows case where it is in a high temperature hang-up state.

If the preset temperature of the wavelength conversion element goes up as shown in FIG. 16 (a), the phenomenon in which the amount of electric power supply to the heater turns into the maximum at the temperature Tc, is shown. In general, when the temperature of the wavelength conversion element 5 is simply raised, if the amount of electric power supply to the heater is increased, the temperature of the wavelength conversion element should also rise. However, as shown in FIG. 16 (a), in fact, the amount of electric power supply to the heater 7 turns into the maximum at certain preset temperature. The preset temperature of the wavelength conversion element at which this amount of electric power supply turns into the maximum is in agreement with the preset temperature at which the light output of a laser light source turns into the maximum (that is, the conversion efficiency of the wavelength conversion element is the highest).

This phenomenon can be explained as set forth below. Although most part of infrared rays outputted from the semiconductor laser 2 is changed into visible light at around the temperature (Tc) at which the amount of electric power supply to the heater 7 turns into the maximum, they are mostly trapped as infrared rays in a temperature range where a rate at which the infrared rays are changed into visible light, is low, and are used for heating the wavelength conversion element 5, that is, the so-called heating due to radiation heat (the above-described IR radiation heating). Because, as mentioned above, since the temperature of the wavelength conversion element 5 is controlled in a feedback manner so as to turn into the preset target temperature in the laser light source apparatus shown in FIG. 14, the amount of electric power supply to the heater 7 is also controlled so as to increase or decrease depending on increase or decrease in disturbance of these infrared rays. Therefore, in a range in which the heater 7 receives much radiant heat, even the amount of electric power supplied to the heater 7 is small, it turns into the setting temperature sufficiently. On the other hand, since the above-described radiant heat is decreasing at a point (near the temperature Tc) where high conversion efficiency to visible light is high, the temperature control unit 21b performs control so that the amount of electric power supply to the heater 7 may increase. For this reason, a point at which the amount of electric power supply is largest may be considered as a temperature range where the conversion efficiency of the wavelength conversion element is the highest.

And now, adjustment of light intensity is generally needed depending on the usage environment or lighting conditions in a projector light source. For example, light intensity needed when an image is projected in the outdoor of a fine day, differs from that needed when an image is projected in a dark room such as a movie theater etc. Moreover, the electric power supplied to a light source in case where a projector is turned on in power-saving mode, is greatly different from that in case where the light is usually lighted on with normal electric power. Thus, it become necessary to control increase and decrease of laser lighting current to the laser light source apparatus used as a light source. However, if laser lighting current is increased according to a laser intensity increase command, as explained below, the temperature of the wavelength conversion element will be held at temperature higher than the optimal wavelength conversion temperature so that the laser light source apparatus may be put in the high temperature hang-up state. Therefore, it turns out that a desired conversion light output may not be obtained so that the light intensity may decrease sharply.

The above-mentioned high temperature hang-up will be explained below. In the above-mentioned laser light source apparatus, if laser lighting current is increased according to a laser intensity increase command, the amount of heating to the wavelength conversion element 5 by laser light will also increase. For this reason, the temperature of the wavelength conversion element 5 rises temporarily. When the amount of heating to the wavelength conversion element 5 by the laser light is increased, the IR radiation heat quantity A, and the total heat C shown in FIG. 16 increases. For this reason, although the temperature control unit 21b performs control so as to decrease the amount of electric power supply to the heater 7, it becomes impossible to control the temperature of the wavelength conversion element 5, as shown in FIG. 16 (b), in case where the temperature of the wavelength conversion element 5 does not fall even if the output to a heating circuit is blocked. As a result, the temperature of the wavelength conversion element 5 rises, and the temperature of the wavelength conversion element 5 goes into a range of a high temperature hang-up state shown in FIG. 16 (b), and the laser light source apparatus will go into the state of the high temperature hang-up 2. That is, in FIG. 16 (b), if the amount of electric power supply to the heater 7 is controlled so that the temperature of the wavelength conversion element is raised, the amount of heating to the wavelength conversion element 5 based on fundamental wave light will become larger than the energy which is necessary to keep the temperature. In that case, even if the electric power supply to the heater 7 is stopped, the temperature of the wavelength conversion element 5 goes up continuously and rises to the temperature of the high temperature hang-up 2 and stops. If the laser light source apparatus falls into this high temperature hang-up, even if the electric power supply to the heater 7 is stopped, the temperature of the wavelength conversion element (PPLN) cannot be lowered.

FIG. 17 is a time chart which shows an operation at time when the laser light source apparatus goes into a high temperature hang-up state. In the figure, (a) shows timing of a light control trigger (laser current increase command), (b) shows change of laser current, (c) shows the amount of electric power supply to a heater, and (d) shows the temperature of the wavelength conversion element. As shown in FIG. 17 (a), if a command (light control command) for increasing laser intensity is received, the electric power supply circuit U1 shown in FIG. 14 immediately increases the laser current as shown in (b) of the figure, so that the level of the laser current changes from IL1 to IL2 (increased amount A). Thereby, as shown in (d) of the figure, the temperature of the wavelength conversion element 5 rises.

Here, in case where the temperature of the wavelength conversion element 5 does not rise much, for example, because the amount of the increase of the laser current based on a command for increasing the laser intensity is small etc., the temperature of the wavelength conversion element goes up as shown as a dashed line of (d) of the figure, so that it does not go into a high temperature hang-up state. Namely, although, as shown in (c) of the figure, the amount of electric power supply to the heater 7 from the drive circuit U3 drops once, after that, when the temperature of the wavelength conversion element 5 turns into temperature at which the conversion efficiency becomes the maximum (temperature (Tc) at which the amount of electric power supply in FIG. 16 turns into the maximum), as shown as the dashed line of the figure, the amount of electric power supply to the heater changes with a value larger than the zero level. This is in a controllable state in FIG. 16 (a).

On the other hand, if an increase of the laser current based on the command for increasing the laser intensity is large so that the temperature of the wavelength conversion element 5 increases greatly whereby the temperature of the wavelength conversion element increases as shown as a solid line in (d) of the figure, the amount of heating based on fundamental wave light will become larger than the amount of heating needed for maintaining the temperature of the wavelength conversion element. For this reason, it becomes impossible to control the temperature of the wavelength conversion element by increasing and decreasing the amount of electric power supply to a heating unit such as the heater. That is, at the temperature of the high temperature hang-up 1, the amount of heating to the wavelength conversion element 5 based on the fundamental wave light becomes larger than the energy needed for maintaining the temperature, and even if the electric power supply to the heater 7 is stopped, the temperature of the wavelength conversion element 5 goes up continuously and it rises to the temperature of the high temperature hang-up 2 and then stops. Since the temperature of the wavelength conversion element is controlled by the temperature control unit 21b, if it turns into the above-mentioned high temperature hang-up state, the amount of electric power supply to the heater 7 turns into zero level, as shown in (c) of the figure. That is, even if the electric power supply to the heater is stopped, it becomes impossible to lower the temperature of the wavelength conversion element 5 in this state.

As mentioned above, when laser lighting current is increased according to a laser intensity increase command, there is a case where the amount of heating to the wavelength conversion element 5 based on the laser light also increases, and the temperature of the wavelength conversion element 5 stops falling toward the optimal temperature, whereby it becomes impossible to control it (it turns into a high temperature hang-up state). In this high temperature hang-up state, the temperature of the wavelength conversion element 5 will be held at temperature higher than the optimal temperature at which the wavelength conversion efficiency becomes the maximum, so that a desired conversion light output cannot be obtained, whereby the light intensity decreases sharply, and the light intensity rather decreases more than that before the laser intensity increase command is received, and t is maintained.

The present invention solves the above-mentioned problem, and an object of the present invention is to offer a laser light source apparatus capable of recovering a controllable state immediately and recovering a high light output, when the laser light source apparatus goes into a high temperature hang-up state and temperature control of the wavelength conversion element goes out of control.

In a laser light source apparatus in which wavelength conversion is performed using a wavelength conversion element in which the conversion efficiency changes according to the temperature and there is the optimal temperature at which the optical conversion efficiency turns into the maximum, temperature control of the wavelength conversion element is performed by a heating unit such as a heater without using a means such as a Peltier device capable of performing cooling, and in the laser light source apparatus in which fundamental wave light is not leaked out of a package, and part of fundamental wave light whose wavelength is not converted contributes to heating to the wavelength conversion element, the laser light source apparatus may go into a high temperature hang-up state, as described above. This high temperature hang-up state is defined as a state where it becomes impossible to lower the temperature even if the electric power supply to the heating unit such as a heater is stopped since in the above-mentioned laser light source apparatus, at a high-temperature region which is higher than that at which the conversion efficiency of the wavelength conversion element turns into the maximum, the amount of heating based on fundamental wave light (IR radiation heat quantity) becomes larger than the amount of heat needed for maintaining that temperature, so that it becomes impossible to control the temperature of the wavelength conversion element by increasing and decreasing the amount of electric power supply to the heating unit such as a heater.

According to the present invention, a high temperature hang-up suppressing unit is provided in the laser light source apparatus, and when the laser light source apparatus goes into a high temperature hang-up state, the amount of electric power supply to the semiconductor laser is decreased by a preset amount so as to recover from such a high temperature hang-up state. For example, a high temperature hang-up state is recovered as described below. When a state where the amount of electric power supply of the heater by a temperature control unit is the predetermined lower limit or below, continues for a predetermined period or more, the amount of electric power supply to the semiconductor laser is decreased by a predetermined amount. Or by detecting a duration time where actually measured temperature of the wavelength conversion element is higher than the control target temperature of the wavelength conversion element, when the duration time becomes larger than a predetermined constant value, the amount of electric power supply to the semiconductor laser is decreased by a predetermined amount. Thereby, the amount of heating to the wavelength conversion element by laser light is decreased, so that the wavelength conversion element returns to a temperature controllable state, whereby the light intensity with the high conversion efficiency can be stably obtained. Moreover, a decreased part of the amount of electric power supply to the semiconductor laser may be a value proportional to an increased part of the amount of electric power supply to the semiconductor laser at time when the high temperature hang-up state arises after the amount of electric power supply to the semiconductor laser is increased. Moreover, in order not to go into the high temperature hang-up state, a high temperature hang-up suppressing unit described below can also be provided. That is, the high temperature hang-up suppressing unit temporarily stops the electric power supply to the heating circuit (or decreases the amount of electric power supply), and increases the laser intensity in a fixed period after a laser intensity increase command. Thereby, it is possible to offer a laser light source apparatus capable of stable temperature control of the wavelength conversion element, wherein it becomes possible to suppress excessive temperature rise of the wavelength conversion element, so that a high temperature hang-up can be prevented.

That is, the present invention solves the above-mentioned subject as set forth below.

(1) A laser light source apparatus, comprises a semiconductor laser; a wavelength conversion element which carries out wavelength conversion of laser light emitted from the semiconductor laser; a heater which heats the wavelength conversion element; an electric power supply circuit which supplies electric power to the semiconductor laser; a heater electric power supply circuit which supplies electric power to the heater; a temperature control unit which detects the temperature of the wavelength conversion element, controls the amount of electric power supply to the heater, and controls the temperature of this wavelength conversion element so as to become target temperature; and a control unit, which controls the heater electric power supply circuit and the electric power supply circuit which supplies electric power to the semiconductor laser, wherein the control unit is provided with a high temperature hang-up suppressing unit which suppresses this high temperature hang-up state by decreasing electric power supply to the semiconductor laser by a predetermined amount, when a high temperature hang-up state occurs where the temperature of the wavelength conversion element cannot be controlled even if the amount of electric power supply to the heater is reduced in a temperature region higher than the temperature at which the conversion efficiency of the wavelength conversion element turns into the maximum.

(2) In the laser light source apparatus, the high temperature hang-up suppressing unit decreases electric power supply to the semiconductor laser by a predetermined amount, when the amount of electric power supply to the heater by the temperature control unit is the predetermined lower limit or below for a predetermined period or more, the amount of electric power supply to the semiconductor laser is decreased by a predetermined amount, by regarding it as occurrence of the high temperature hang-up state.

(3) In the laser light source apparatus, the high temperature hang-up suppressing unit decreases electric power supply to the semiconductor laser by a predetermined amount when the temperature of the wavelength conversion element is higher than the target temperature by a predetermined constant temperature or more for a predetermined period or longer, which is regarded as occurrence of a high temperature hang-up state.

(4) In the laser light source apparatus, when a high temperature hang-up state arises due to an increase of electric power supply to the semiconductor laser, the high temperature hang-up suppressing unit decreases electric power supply to the semiconductor laser by an amount proportional to the increased amount of electric power supply to the semiconductor laser.

(5) In the laser light source apparatus, the wavelength conversion element is made of periodically poled lithium niobate.

(6) A laser light source apparatus, comprises a semiconductor laser; a wavelength conversion element which carries out wavelength conversion of laser light emitted from the semiconductor laser; a heater which heats the wavelength conversion element; an electric power supply circuit which supplies electric power to the semiconductor laser; a heater electric power supply circuit for supplies electric power to the heater; a temperature control unit which detects the temperature of the wavelength conversion element, controls the amount of electric power supply to the heater, and controls the temperature of the wavelength conversion element so as to become desired temperature; a control unit which controls the heater electric power supply circuit and the electric power supply circuit which supplies electric power to the semiconductor laser, wherein the control unit is provided with a second unit which suppress this high temperature hang-up when a high temperature hang-up state occurs where the temperature of the wavelength conversion element cannot be controlled even if the amount of electric power supply to the heater is reduced in a temperature region higher than the temperature at which the conversion efficiency of the wavelength conversion element turns into the maximum. In response to an increase command of the amount of electric power supply to the semiconductor laser, the second hang-up suppressing unit stops the electric power supply to the heater or decreases the amount of electric power supply so as to be a predetermined value until a first period T2 passes from time the increase command, and increases the amount of electric power supply to the semiconductor laser after a second period T1 passes from the increase command.

(7) In the laser light source apparatus, the second high temperature hang-up suppressing unit changes the length of the first period T2 according to the increased amount of electric power supply to the semiconductor laser in the increase command.

(8) In the laser light source apparatus, the second high temperature hang-up suppressing unit changes the length of the second period T1 according to the increased amount of electric power supply to the semiconductor laser in the increase command.

(9) In the laser light source apparatus, the wavelength conversion element is made of periodically poled lithium niobate.

Effects set forth below can be acquired according to the present invention.

(1) When the amount of heating to the wavelength conversion element due to the fundamental wave light increases with an increase in laser intensity (increase in lighting current) and a high temperature hang-up state occurs wherein, in a temperature region higher than the temperature at which the conversion efficiency of the wavelength conversion element turns into the maximum, the temperature of the wavelength conversion element cannot be controlled even if the amount of electric power supply to the heater is reduced, electric power supply to the semiconductor laser is decreased by a predetermined amount, whereby it is possible to recover from the high temperature hang-up state. For this reason, it is possible to recover the laser light source apparatus so as to go into a controllable state, so that outgoing light with light intensity where the conversion efficiency is high and stabilized, can be obtained.

(2) Since an occurrence of the high temperature hang-up state is detected when the amount of electric power supply to the heater is the predetermined lower limit or below for a predetermined period or more, or when the temperature of the wavelength conversion element is higher than the target temperature by a predetermined constant temperature a predetermined period or more, it becomes possible to comparatively simply detect that the high temperature hang-up state arises, without adding a new hardware etc. by modifying part of processing for controlling the temperature of the wavelength conversion element.

(3) Where the amount of electric power supply to the semiconductor laser increase so that a high temperature hang-up state arises, since the amount of electric power supply to the semiconductor laser is decreased by an amount proportional to an increased part of the amount of electric power supply to the semiconductor laser, a decreased amount of outgoing light can be made small when an increase in the amount of electric power supply to the laser is small, so that it is possible for a decrease of brightness not to get into someone's eyes.

(4) When the second hang-up suppressing unit is provided, although the fundamental wave light, which is incident on the wavelength conversion element, increases due to an increase in laser intensity (increase in lighting current). However, in response to an increase command as to the amount of electric power supply to the semiconductor laser, the second hang-up suppressing unit stops the electric power supply to the heater or decreases the amount of electric power supply to a predetermined value until a first period T2 passes from time an increase command is given, and increases the amount of electric power supply to the semiconductor laser after a second period T1 passes from time the increase command is given, whereby it is possible to suppress a situation where the temperature of the wavelength conversion element becomes higher than a desired temperature by an increase in the fundamental wave light due to an increase in laser intensity. For this reason, it is possible to prevent an uncontrollable state (high temperature hang-up state) where temperature does not drop even if heating is stopped in a temperature region higher than temperature at which the conversion efficiency of the wavelength conversion element turns into the maximum.

(5) If the length of the first period T2 is changed or the length of the second period T1 is changed according to an increased amount of electric power supply to the semiconductor laser based on the laser intensity increase command, when a laser intensity increase amount is small, time during which the heater temperature is not controlled, can be shortened, or delay time until the laser intensity increases from a laser intensity increase command can be shortened.

BRIEF DESCRIPTION OF THE DRAWING

Other features and advantages of the present laser light source apparatus will be apparent from the ensuing description, taken in conjunction with the accompanying drawings, in which.

DESCRIPTION

Figure 1:
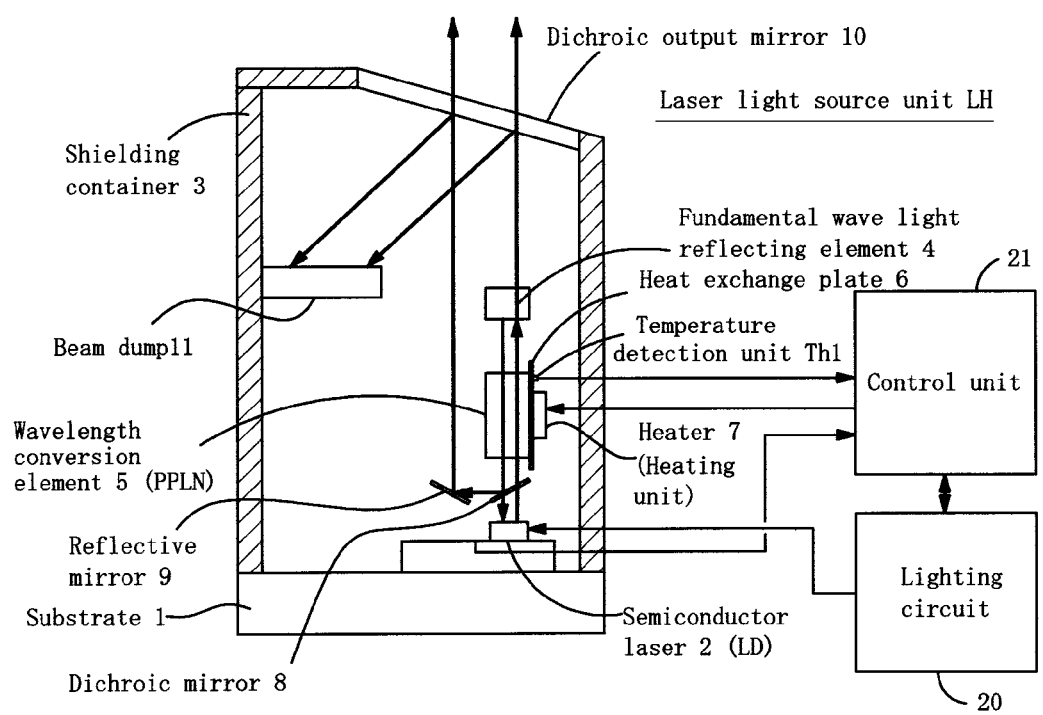
FIG. 1 is a diagram showing a configuration of a laser light source apparatus according to an embodiment of the present invention.

FIG. 1 is a diagram showing the configuration of a laser light source apparatus according to an embodiment of the present invention. As shown in FIG. 1, the laser light source apparatus has a laser light source unit LH, a lightning circuit 20 for lighting a semiconductor laser and a control unit 21. In the laser light source unit LH, a shielding container 3 (made of, for example, aluminium) which prevents leak of laser light and insulates components stored thereinside, from outside air or dust, is provided on a substrate 1, which serves as a base plate (heatsink) and which is made of material with high thermal conductivity, for example, copper (Cu). A semiconductor laser 2, which emits infrared light as fundamental wave light, is formed on the substrate 1 within the shielding container 3. The semiconductor laser 2 is an external resonator type surface-emitting laser array, which emits light of wavelength of 1064 nm.

A fundamental wave light reflecting element 4, (for example, a VBG) which reflects light in a specific narrow wavelength band of the fundamental wave light, with high reflectance (for example, 99.5%), is arranged so as to face the semiconductor laser 2, and forms an external resonator with respect to the semiconductor laser 2. In addition, the fundamental wave light reflecting element 4 transmits conversion light. Moreover, a wavelength conversion element 5 (for example, the above-mentioned PPLN), which changes part of light among wavelengths of fundamental wave light (which is phase-matched wavelength light and whose phase matching temperature is 80 degrees Celsius to 100 degrees Celsius), so as to form wavelength conversion light (second harmonic wave: SHG), is arranged between the semiconductor laser 2 and the fundamental wave reflecting element 4. The wavelength conversion element 5 changes infrared light, which is emitted from the semiconductor laser 2 and which is fundamental wave light thereof, into visible light or ultraviolet light. A heat exchanger plate 6 is arranged on and is brought thermally in contact with the wavelength conversion element 5, and a heating unit 7 (for example, heater), which is means for heating the wavelength conversion element 5, and a temperature detection unit Th1 (for example, a thermistor), which detects the temperature of the wavelength conversion element 5, are provided on the heat exchanger plate 6. An external resonator type vertical surface-emitting laser is formed by the semiconductor laser 2, the wavelength conversion element 5, and the fundamental wave light reflecting element 4, and here a portion which is made up of the semiconductor laser 2, the wavelength conversion element 5, and the fundamental wave light reflecting element 4 is referred to as a light source part 12.

A dichroic output mirror 10 is provided in a face of the shielding container 3 which faces the substrate 1, wherein wavelength conversion light outputted by passing through the fundamental wave light reflecting element 4 is emitted from this dichroic output mirror 10. The dichroic output mirror 10 reflects fundamental wave light without transmission, which is not reflected by but passes through the fundamental wave light reflecting element 4. The fundamental wave light reflected by the dichroic output mirror 10 enters a beam dump 11 (for example, black-colored-alumite treated aluminium plate), and is absorbed thereby. The beam dump 11 is thermally in contact with the shielding container 3. Moreover, a dichroic mirror 8, through which the fundamental wave light passes, and by which the wavelength conversion light is reflected and taken out in a transverse direction, is provided between the semiconductor laser 2 and the wavelength conversion elements 5, wherein the wavelength conversion light reflected by this dichroic mirror 8 is reflected by the reflective mirror 9 in the same direction as that of the wavelength conversion light which passes through the fundamental wave light reflecting element 4, and passes through the dichroic output mirror 10 and is emitted therefrom. That is, the light source part 12 of the laser light source apparatus, which is the subject of the present invention, includes the wavelength conversion element 5 which carries out wavelength conversion of the fundamental wave light emitted from the semiconductor laser 2, and the fundamental wave light reflecting element 4 (for example, VBG), which is arranged on a light emission side of the wavelength conversion element 5. The fundamental wave light reflecting element 4 reflects, with high reflectance, light in the specific narrow wavelength band of the fundamental wave light among the lights emitted from this wavelength conversion element 5 and constitutes an external resonator with respect to the semiconductor laser 2. In addition, although a holding member for holding each component, etc. is provided, they are not shown in the figure.

In FIG. 1, the fundamental wave light emitted from the semiconductor laser 2 enters the wavelength conversion element 5 through the dichroic mirror 8, as shown in an arrow of the figure. Wavelength conversion of part of the light which enters the wavelength conversion element 5 is carried out, and this wavelength-converted light passes through the fundamental wave light reflecting element 4, and is emitted through the dichroic output mirror 10. Moreover, the fundamental wave light whose wavelength is not converted by the wavelength conversion element 5 is reflected by the fundamental wave light reflecting element 4 and enters the wavelength conversion element 5, and wavelength conversion thereof is carried out by the wavelength conversion element 5. The light whose wavelength has been converted is reflected by the dichroic mirror 8 and is emitted through the reflective mirror 9 and the dichroic output mirror 10. Moreover, the fundamental wave light, which has not been converted in wavelength by the wavelength conversion element 5 and which enters the dichroic mirror 8, passes through the dichroic mirror 8, and enters the semiconductor laser 2. On the other hand, the fundamental wave light which passes through the fundamental wave light reflecting element 4 without reflection by this element, and the fundamental wave light which is reflected without passing through the dichroic mirror 8, and which is reflected by the reflective mirror 9, are reflected by the dichroic output mirror 10, as shown in arrows of the figure, and enters the beam dump 11 thereby being absorbed.

As the wavelength conversion element 5, lithium niobate ($LiNbO_3$) having a periodic polarization reversal structure, lithium niobate in which magnesium is doped (MgO: $LiNbO_3$), lithium tantalum niobate ($LiTaNbO_3$), lithium tantalate ($LiTaO_3$), or potassium titanyl phosphate ($KTiOPO_4$) etc. can be used. In general, a quasi phase matching type wavelength conversion element, which is called periodically poled lithium niobate (PPLN), periodically poled magnesium doped lithium niobate (PPMgLN), periodically poled lithium tantalate (PPLT), or periodically poled potassium titanyl phosphate (PPKTP) can be used.

As shown in FIG. 1, the control unit 21 and the lightning circuit 20 are provided in the light source apparatus according to this embodiment. The lightning circuit 20 supplies pulse-like electric power to the semiconductor laser 2, thereby lighting the semiconductor laser 2. While the control unit 21, for example, controls the lightning circuit 20 thereby controlling an operation of the laser light source apparatus, the control unit 21 performs control so that the temperature of the wavelength conversion element 5 turns into temperature at which the wavelength conversion element 5 has optimal wavelength conversion efficiency by controlling the temperature of the wavelength conversion element 5. That is, the temperature of the wavelength conversion element 5 detected by the temperature detection unit Th1 is inputted into the control unit 21. The control unit 21 sets the temperature of the wavelength conversion element at time when the conversion efficiency of the wavelength conversion element becomes the maximum as an optimal setting temperature of the wave conversion element, and controls the amount of heat by the heating unit 7 (for example, heater) so that the temperature of the wavelength conversion element 5 may be the above mentioned optimal setting temperature whereby the temperature of the wavelength conversion element 5 is controlled in a feedback manner.

Figure 2:
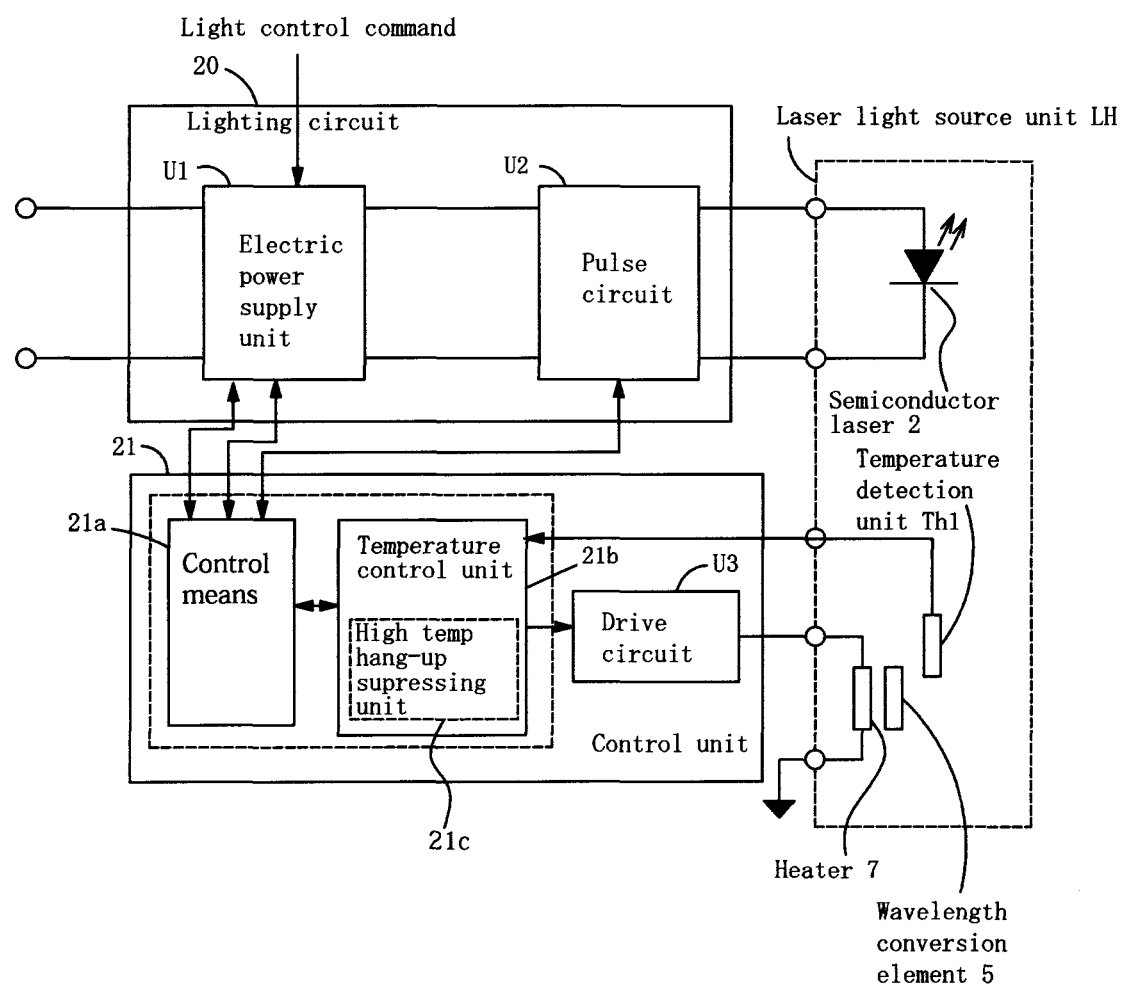
FIG. 2 is a block diagram showing a configuration of a control unit and a lightning circuit in a laser light source apparatus according to a first embodiment of the present invention.

FIG. 2 is a block diagram showing the structure of the control unit and the lighting circuit in the laser light source apparatus according to a first embodiment of the present invention. The lightning circuit 20 comprises, as shown in the figure, an electric power supply circuit U1, which is represented by a step-down chopper and a boost chopper or which is formed from another type of switching circuit etc.; and a pulse circuit U2 which supplies pulse-like electric power, wherein suitable voltage/current is outputted to the semiconductor laser 2 according to a state or lighting sequence of the semiconductor laser 2. A system, which impresses pulse voltage in a rectangle wave shape at approximately hundreds kHz to the laser, depending on a kind of the laser, is known well. In the present embodiment, the pulse circuit U2 is arranged on the output side of the electric power supply circuit U1, and generates a pulse at desired frequency, so as to output it to the semiconductor laser 2. In addition, it is not limited thereto in case of a different kind of laser, which is different from the above, and except the pulse circuit U2, the output voltage from the electric power supply circuit U1 may be directly impressed to the laser light source which corresponds to the semiconductor laser 2.

The semiconductor laser 2 shown in the present embodiment emits infrared rays, and has the wavelength conversion element 5 (for example, PPLN), which is an element for converting wavelength of light, in order to make conversion into visible light. This wavelength conversion element 5 has a feature in which quasi phase matching is carried out so as to raise the optical conversion efficiency, by raising it to predetermined temperature, and thus very accurate temperature control is required. Therefore, the laser light source unit LH also has the wavelength conversion element 5 and the heating unit 7 (hereafter explained as a heater 7) for raising the temperature of the wavelength conversion element 5. The element temperature detection unit Th1 which detects the temperature of the heater 7 (that is, the temperature of the wavelength conversion element 5), for example, a thermistor, is arranged.

Moreover, the control unit 21 comprises a control means 21a, a temperature control unit 21b, and a drive circuit U3, wherein the drive circuit U3 which drives the heater 7 is driven by an output of the temperature control unit 21b. The electric power supply circuit U1 is controlled so that voltage impressed to the semiconductor laser 2 and current to be passed therethrough may turn into a preset value or a value set up from the outside, by the control unit 21. Moreover, start or stop of the electric power supply etc. is controlled thereby. The control means 21a and the temperature control unit 21b of the control unit 21 are formed by, for example, an arithmetic processing unit (a CPU or a microprocessor). Moreover, the pulse circuit U2 is controlled by the temperature control unit 21b of the control unit 21. The temperature control unit 21b determines optimal pulse frequency and a duty cycle ratio for acquiring high optical power efficiency, turns on and off a switching element of the pulse circuit U2 according to these values, and generates a pulse output which drives the semiconductor laser 2.

The temperature control unit 21b of the control unit 21 is equipped with a high temperature hang-up suppressing unit 21c, wherein when it goes into a high temperature hang-up state, as described below, the high temperature hang-up suppressing unit 21c reduces the amount of electric power supply to the semiconductor laser by a predetermined amount, thereby preventing this high temperature hang-up state. Thereby, it becomes possible to suppress the excessive temperature rise of the wavelength conversion element so that recovery from the high temperature hang-up can be made. Based on a difference of the temperature detected by the element temperature detection unit Th1 and the preset temperature which is temperature at which the conversion efficiency of the wavelength conversion element turns into the maximum, the temperature control unit 21b controls the amount of electric power supply to the heater 7, so that the temperature of the wavelength conversion element 5 turns into the preset temperature. That is, the temperature control unit 21b drives the drive circuit U3 so as to control the amount of electric power supply to the heater 7, whereby feedback control is carried out so that the temperature of the wavelength conversion element 5 detected by the element temperature detection unit Th1 may turn into the preset temperature. Specifically, the temperature control unit 21b sends out, to the drive circuit U3, a signal which indicates the amount of electric power supply in order to control the amount of electric power supply to the heater 7, and the drive circuit U3 drives the heater 7, and feedback control is carried out so that the temperature of the wavelength conversion element 5 may be the preset temperature. A form of an output from the drive circuit U3 may be of an output of a voltage level, and may be of controlling the amount of electric power supply using a PWM system.

Figure 3:
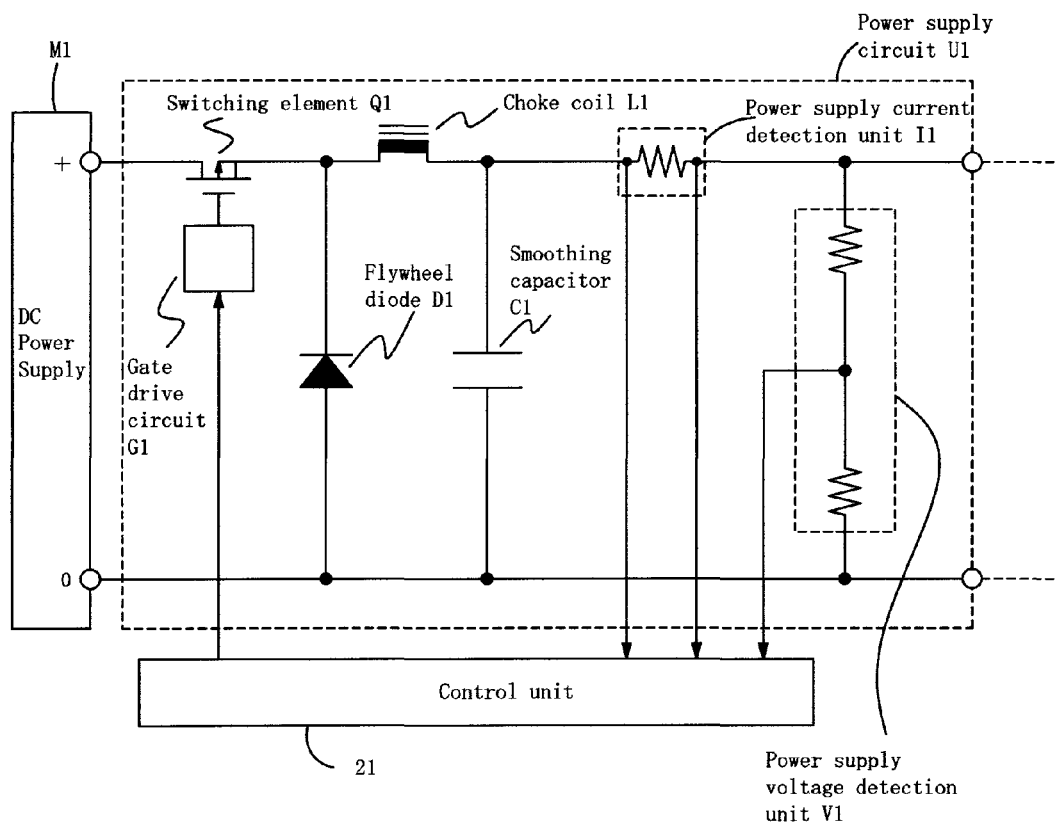
FIG. 3 is a diagram showing a configuration example in which an electric power supply circuit is realized.

FIG. 3 is a diagram showing a configuration example by which the electric power supply circuit U1, which can be used by the lightning circuit 20 in the laser light source apparatus of the present embodiment, is realized. The electric power supply circuit U1, which is based on a step-down chopper circuit, operates in response to a supply of voltage from a DC power supply M1, and performs adjustment of the amount of electric power supply to the semiconductor laser 2. The electric power supply circuit U1 is configured so that the control unit 21 drives a switching element Q1 such as an FET so that current from the DC power supply M1 is turned on and off thereby charging a smoothing capacitor C1 through a choke coil L1, and current is supplied to the semiconductor laser 2. In addition, during a period in which the switching element Q1 is in an ON state, while direct charge to the smoothing capacitor C1 and current supply to the semiconductor laser 2 which is a load, is performed, energy is stored in the choke coil L1 in form of magnetic flux, by the current which passes through the switching element Q1. During a period in which the switching element Q1 is in an OFF state, by energy which is stored in the choke coil L1 in form of magnetic flux, charge to the smoothing capacitor C1 and current supply to the semiconductor laser 2 is performed through a flywheel diode D1. In addition, the halt condition of the electric power supply circuit U1 previously explained in relation to FIG. 2 refers to a state where the switching element Q1 is stopping in an OFF state.

In the step-down chopper type electric power supply circuit U1, the amount of electric power supplied to the semiconductor laser 2 can be adjusted according to a duty cycle ratio which is a ratio of a period during which the switching element Q1 is in an ON state, to an operation cycle of the switching element Q1. Here, a gate drive signal, which has a certain duty cycle, is generated by the control unit 21, so that ON and OFF of the current from the DC power supply is controlled by controlling a gate terminal of the switching element Q1 through a gate drive circuit G1. It is configured so that the current and voltage to the semiconductor laser 2 can be detected by an electric power supply current detection unit I1 and an electric power supply voltage detection unit V1, respectively. In addition, the electric power supply current detection unit I1 can be easily realized by using a shunt resistor, and the electric power supply voltage detection unit V1 can be realized by using a voltage dividing resistors.

An electric power supply current detection signal from the electric power supply current detection unit I1 and an electric power supply voltage detection signal from the electric power supply voltage detection unit V1 are inputted into the control unit 21, whereby the control unit 21 outputs a gate drive signal in order to carry out on-off control of the switching element Q1, and carries out feedback control so that target current may be outputted. Therefore, it is possible to supply suitable electric power or current to the laser.

Figure 4:
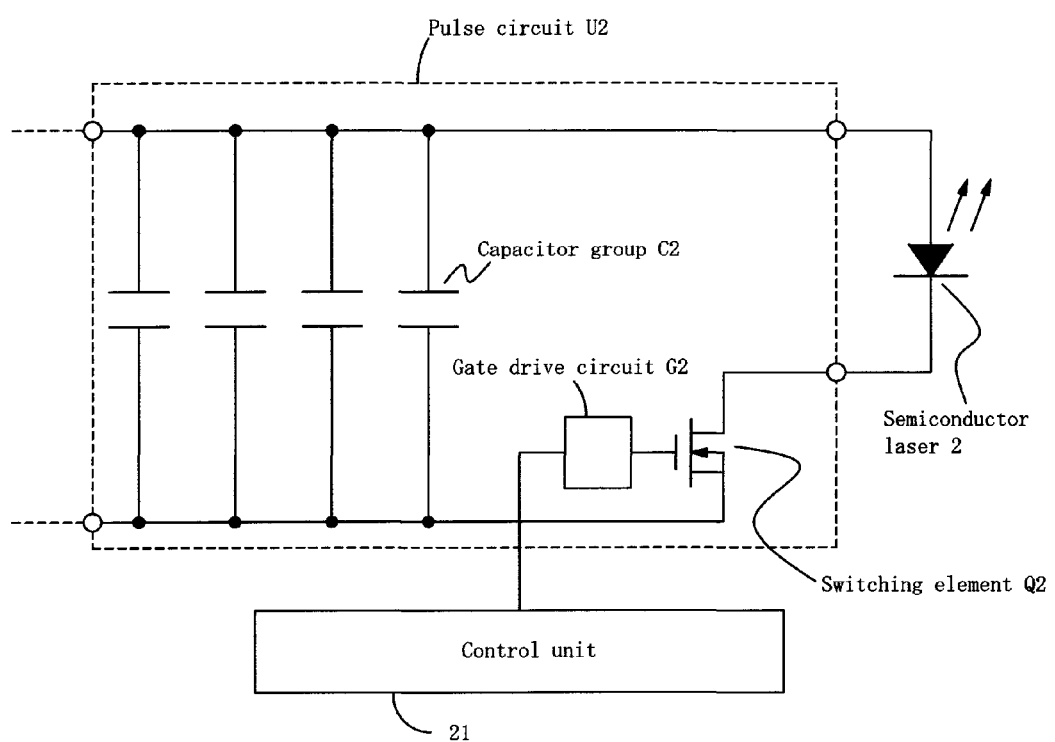
FIG. 4 is a diagram showing a schematic configuration example of a pulse circuit.

FIG. 4 is a diagram showing a schematic configuration example of the pulse circuit U2 which can be used for the lighting circuit 20 in the laser light source apparatus according to the present embodiment. The pulse circuit U2 is configured by a circuit in which a switching element Q2 such as an FET is used. The switching element Q2 is driven through a gate drive circuit G2 according to a signal generated by the control unit 21. An ON and OFF operation of the switching element Q2 is repeated at a high speed, and every time it is turned ON, electric power is supplied to the semiconductor laser 2 through this switching element Q2 from a capacitor group C2 charged by an output of the electric power supply circuit U1.

For example, in a system in which pulse voltage in rectangle wave shape is impressed to the laser at approximately hundreds of kHz, a joint part temperature (junction temperature) in a semiconductor device, for example, a laser diode in a pulse drive system can be lowered more than that in case of a simple DC drive. As a result, it is effective in raising the efficiency of optical output. If DC drive of the laser diode is carried out, since forward direction voltage in general drops compared with that in case of a pulse drive, and if electric power, which is comparable in size, is supplied to the laser diode, it is necessary to increase supply of current. This is because a loss due to a rise of current increases as a result so that the temperature of the junction increases. In any event, the control unit 21 determines the optimal pulse frequency and the duty cycle ratio for acquiring higher optical output efficiency, and the semiconductor laser 2 may be driven according to these values. However, assuming that there is some deterioration of optical output efficiency, because of the cost balance, the pulse circuit U2 may be removed and the semiconductor laser 2 etc. may be DC-driven directly.

Figure 5:
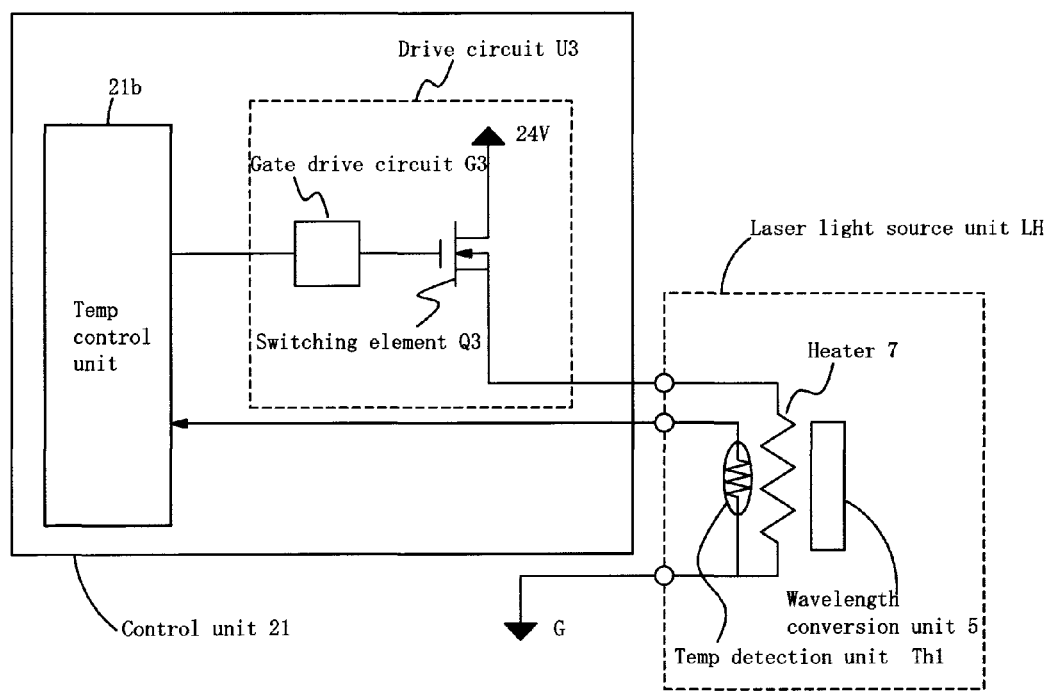
FIG. 5 is a figure showing a configuration of a drive circuit and a connection relation of control unit and a heater etc.

FIG. 5 is a diagram of a schematic configuration example, showing a connecting relation of the drive circuit U3, the temperature control unit 21b of the control unit 21, and the wavelength conversion element 5, etc. in the laser light source apparatus according to the embodiment of the present invention. The laser light source unit has the wavelength conversion element 5, wherein there is condition(s) where optical power is maximized, that is, where the efficiency of optical wavelength conversion becomes highest. The condition is the temperature of the wavelength conversion element 5, so that high conversion efficiency can be acquired by giving suitable temperature conditions thereto. Therefore, it is necessary to provide mechanism, in which the wavelength conversion element 5 is adjusted to so as to be the optimal temperature by raising the temperature of the wavelength conversion element 5 from the outside. Therefore, the heater 7 is provided adjacent to the wavelength conversion element 5, and it becomes important to control the heater 7 so that the temperature of the wavelength conversion element 5 may turn into optimal temperature.

The description of the suitable temperature condition(s) of the wavelength conversion element 5 will be supplemented, below. Due to a manufacturing factor, the structure of the wavelength conversion element 5 or manufacturing reasons, the optimal values differ from one individual to the next, and for example, the temperature is approximately 80 degrees Celsius to 100 degrees Celsius, so that there is "variation" in approximately the same degree. As described above, the arithmetic processing unit (a CPU or a microprocessor) which forms the control unit 21 needs to perform control to attain the optimal temperature condition(s) of the wavelength conversion element 5. In order to maintain the temperature of the wavelength conversion element 5 at desired constant temperature, the temperature of the heater 7 is indirectly controlled, in order to realize this. Therefore, the temperature detection unit Th1 is arranged on the heat exchanger plate 6 (refer to FIG. 1) near the heater 7.

As described above, the control unit 21 has the temperature control unit 21b, wherein the temperature control unit 21b acquires temperature information of the wavelength conversion element 5 from the temperature detection unit Th1. And the setting temperature and the temperature detected by the temperature detection unit Th1 are compared with each other, so that feedback control of the amount of electric power supplied to the heater 7 is carried out. As to a form of a method of supplying electric power to the heater 7, a pulse signal of the PWM signal from the temperature control unit 21b of the control unit 21 is sent out to a gate terminal of the switching element Q3 through a gate drive circuit G3 of the drive circuit U3, so that ON-OFF control of this switching element Q3 is carried out. As a result, predetermined pulse voltage is supplied to the heater 7 at a predetermined cycle from the DC power supply of, for example, DC 24 V. Thus, the control unit 21 controls the amount of electric power supply of the heater 7, whereby stable control is performed so that the temperature of the wavelength conversion element 5 becomes optimal.

Figure 6:
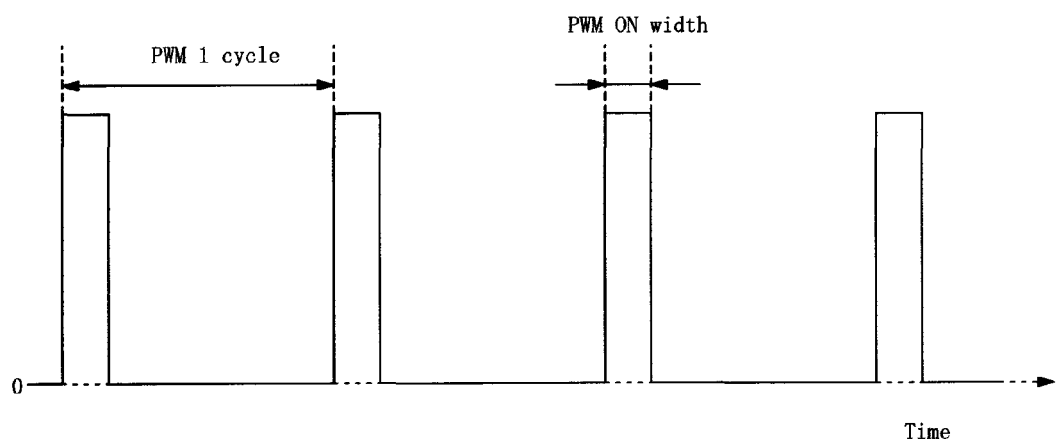
FIG. 6 is a timing chart which shows an example of a current waveform of electric power which is supplied to a heater from a drive circuit.

FIG. 6 is a schematic timing chart showing a waveform of current which is supplied to the heater 7 from the drive circuit U3 in the lighting circuit of the laser light source apparatus according to an embodiment of the present invention. In order to carry out feedback control of the amount of electric power supplied to the heater 7, the temperature control unit 21b of the control unit 21 determines a cycle of PWM and a PWM ON width which are shown in the figure, thereby generating a PWM signal. In addition, instead of the PWM signal, a signal having analog quantity, which is similar to the PWM signal, such as a frequency modulated signal, may be generated. The amount of electric power supplied to the heater 7 is adjusted by an increase and a decrease of this ON width, so that the temperature of the wavelength conversion element 5 is controlled. A control system, which is generally known as "ON/OFF-PID control" can be used" as the feedback control method, as described above. The PID control is a method for performing control so that it becomes a target temperature, wherein a proportionality element, an integration element, and a differentiation element are combined with one another. In addition, for example, a value of approximately several kilohertz is adopted as the frequency of the PWM output used in the present embodiment.

Next, description of the high temperature hang-up suppressing unit 21c according to a first embodiment of the present invention will be given below. The high temperature hang-up suppressing unit 21c suppresses the high temperature hang-up state by decreasing the amount of electric power supply to the semiconductor laser by a predetermined amount, as described above, when the high temperature hang-up state occurs where it becomes impossible to control the temperature of the wavelength conversion element even if the amount of electric power supply to the heater is reduced in a high-temperature region higher than the temperature at which the conversion efficiency of the wavelength conversion element turns into the maximum. It is detected that the laser light source apparatus goes into the high temperature hang-up state, for example, as set forth below, so that the amount of electric power supply to the semiconductor laser is reduced by a predetermined amount. (1) When the amount of electric power supply to the heater by the temperature control unit is the predetermined lower limit or below for a predetermined period or longer, by regarding it as occurrence of the high temperature hang-up state, the amount of electric power supply to the semiconductor laser is decreased by the predetermined amount. (2) A duration time where actually measured temperature of the wavelength conversion element is higher than the control target temperature of the wavelength conversion element, is detected, and when the duration time becomes larger than a predetermined constant value, the amount of electric power supply to the semiconductor laser is decreased by a predetermined amount.

Figure 7:
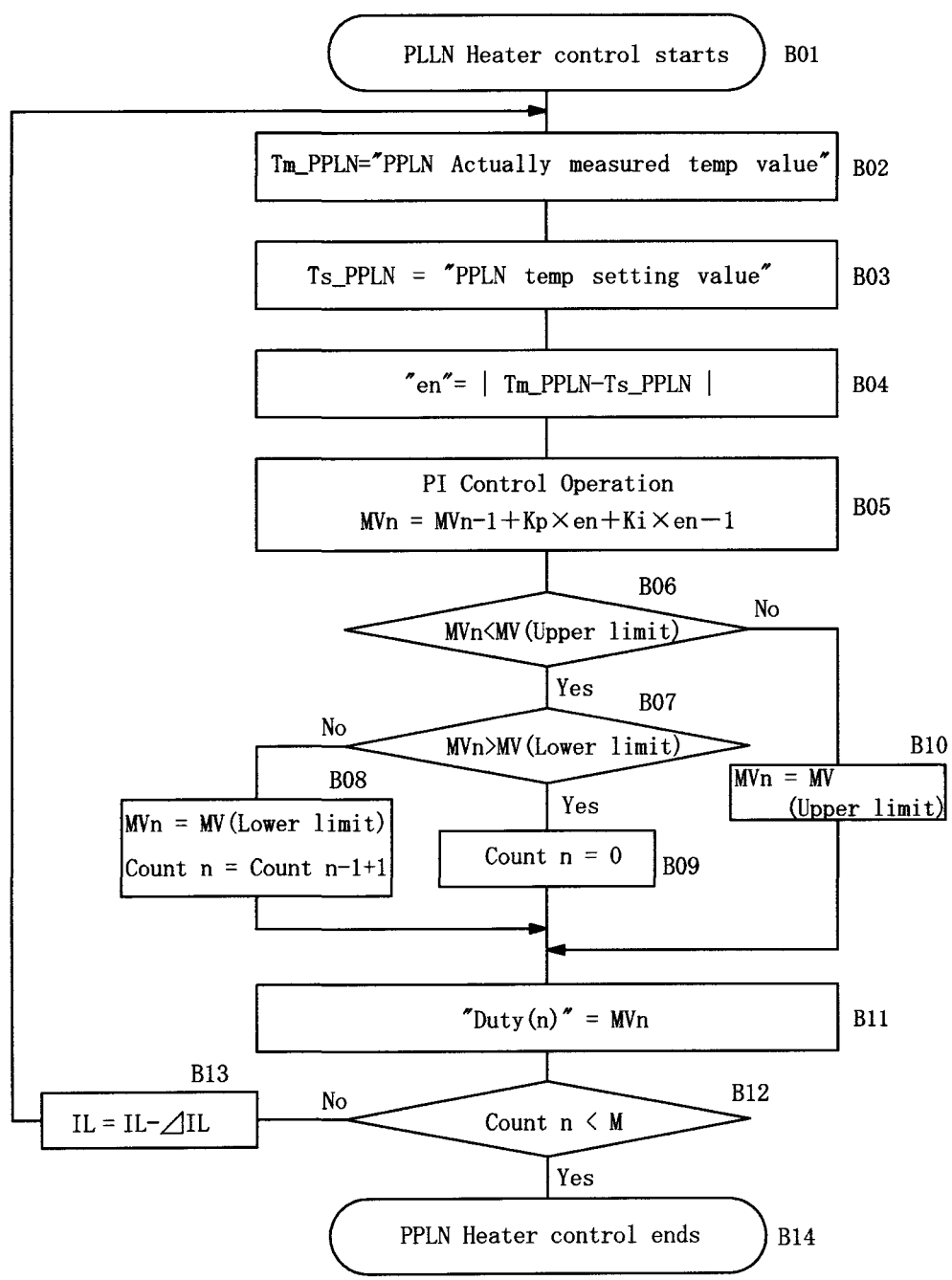
FIG. 7 is a flow chart (1) of temperature control processing which has a high temperature hang-up suppression function according to an embodiment of the present invention.

The high temperature hang-up suppressing operation of the above (1) and (2) can be realized in the software processing which controls the temperature of the wavelength conversion element mounted in the control unit to target temperature, and when it goes into the high temperature hang-up, the temperature control unit 21b of the control unit 21 carries out recovery from the high temperature hang-up state by performing processing set forth below. FIG. 7 is a flow chart of temperature control processing which has a high temperature hang-up suppressing function performed in the temperature control unit according to an embodiment of the present invention. As stated in (1), the figure shows processing in which when the amount of electric power supply to the heater is the predetermined lower limit or below for a predetermined period or longer, by regarding it as occurrence of a high temperature hang-up state, recovery from the high temperature hang-up state is performed. In the processing of FIG. 7, the temperature of the heater (temperature of the wavelength conversion element) is detected, and the detected temperature and target temperature are compared with each other, so that an output manipulating value (the amount of electric power supply) to the heater is periodically calculated based on the deviation, and it will be explained using PI control which is a typical technique.

In FIG. 7, heater control starts at Step (B01). First, in Step (B02), the present temperature of the heat exchanger plate 6 heated by the heater 7, which is correlated with the temperature of the wavelength conversion element 5, that is, an actually measured temperature value (PPLN actually measured temperature value) of the wavelength conversion element 5, is measured by the temperature detection unit Th1, and the actually measured temperature (Tm_PPLN) is obtained. Next, in Step (B03), the target temperature of the wavelength conversion element 5, i.e. a temperature setting value (Ts_PPLN), which is heater target temperature, and which has a correlation with the temperature of the wavelength conversion element (PPLN), is read out. And in Step (B04), the optimal temperature setting value (Ts_PPLN) and the actually measured temperature value (Tm_PPLN) measured by the temperature detection unit Th1 are compared with each other, whereby a difference (en) therebetween is obtained. In Step (B05), a PI operation is performed using this difference (en). In this PI operation, the amount of electric power supplied to the heater 7, i.e., the manipulating value to the heater 7, is calculated from expression (1).

$$MV_n = MV_{n-1} + Kp \times e_n + Ki \times e_{n-1} \quad (1)$$

Here, $MV_n$, $MV_{n-1}$, $e_n$, and $e_{n-1}$ respectively represent a manipulating value of this time, a manipulating value of the last cycle, a temperature difference value which is calculated this time, and a temperature difference value which is calculated in last cycle, and Kp and Ki are constants.

The manipulating value ($MV_n$) computed by the PI operation will be updated as an ON width of a PWM signal to the heater 7 sent out from the control unit 21. However, in Steps (B06, B07), when the manipulating value ($MV_n$) exceeds the maximum ($MV_n$ upper limit), the maximum value (MV upper limit) is treated as the manipulating value ($MV_n$), and when it is less than the minimum value ($MV_n$ lower limit), the minimum value (MV lower value) is treated as the manipulating value, whereby upper limit and lower limit restriction is performed. Steps (B08, B10). Moreover, in order to integrate the number of times of selection of the minimum (MV lower limit) as the manipulating value, when the minimum is selected in Step B07, one (1) is added to a counter at Step (B08), and when the minimum is not selected, the counter is reset to zero at Step (B09). And the manipulating value which is finally determined at the step (B11) is updated as an ON width (Duty (n)) of the PWM signal sent out from the control unit 21.

In Step (B12), the numerical value of the counter and a numerical value M which is set in the control unit 21, are compared with each other, and when the numerical value of the counter is larger than M, it is judged that the laser light source apparatus is in a high temperature hang-up state where it cannot be lowered to the target temperature even if heating by the heater is lowered to the minimum, whereby the supply current to the laser is reduced by a specified value Δ IL which is preset in the control unit 21 in Step (B13). Moreover, when the numerical value of the counter is not larger than M, the processing ends at Step (B14). By repeating the series of control from Step (B02) in a state where the IR heating to the wavelength conversion element has decreased by making reduction by ΔIL, it is possible to make recovery from the high temperature hang-up state and the supply current is also stabilized at a constant value. The series of operations from Step (B01) to Step (B14) are repeated at a predetermined cycle. By performing this flow chart periodically so as to perform the feedback control, it is possible to stably perform control so that the wavelength conversion element (PPLN) becomes optimal in temperature, while avoiding a high temperature hang-up. Although the PI control method which is made up of proportional control and an integration element is used in the above-explained control algorithm, other feedback control methods including, for example, control such as in PID control in which a differentiation (differentiation) element is added, may be used.

Figure 8:
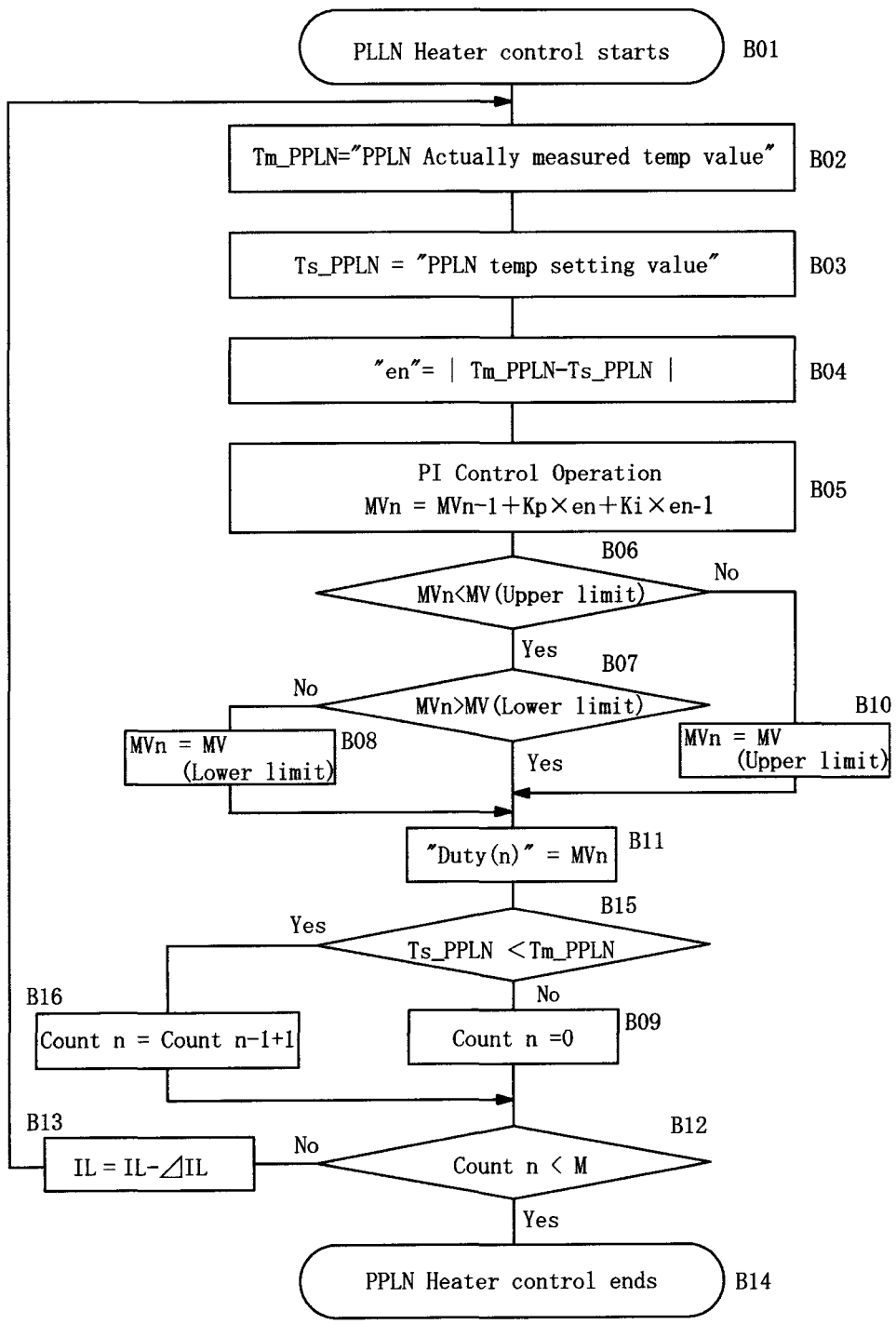
FIG. 8 is a flow chart (2) of temperature control processing which has a high temperature hang-up suppression function according to an embodiment of the present invention.

FIG. 8 is a flow chart of temperature control processing having a high temperature hang-up suppression function, which is performed in the temperature control unit according to an embodiment of the present invention. As stated in (2) which is described above, the figure shows processing in case where when a duration time, during which the temperature is higher than the control target temperature of the wavelength conversion element, becomes longer than a predetermined constant value, it is regarded as occurrence of the high temperature hang-up state, whereby recovery from the high temperature hang-up state is made. In FIG. 8, the processing of Steps B01-B11 is the same as that of FIG. 7, that is, heater control starts at Step (B01), and an actually measured temperature value (PPLN actually measured temperature value) is measured by the temperature detection unit Th1 in Step (B02), whereby the actually measured temperature value (Tm_PPLN) is obtained. Next, a temperature setting value (Ts_PPLN) is read out in Step (B03), and the temperature setting value (Ts_PPLN) and the actually measured temperature value (Tm_PPLN) are compared with each other in Step (B04), and a difference (en) thereof is obtained. In step (B05), a PI operation is performed based on the above-mentioned expression (1).

It is checked whether the manipulating value ($MV_n$) computed by the PI operation exceeds the maximum value (MV upper limit) in Step (B06, B07), or whether it is less than the minimum (MV lower limit). When the manipulating value ($MV_n$) computed by the PI operation exceeds the maximum value (MV upper limit), the maximum value (MV upper limit) is treated as the manipulating value and when it is less than the minimum (MV lower limit), the minimum value (MV lower limit) is treated as the manipulating value. Thus, upper and lower limit restriction is performed. Steps (B08, B10). And the manipulating value which is finally determined in Step (B11) is updated as an ON width (Duty (n)) of the PWM signal sent out from the control unit 21. Next, it is checked whether the actually measured temperature value (Tm_PPLN) is larger than the temperature setting value (Ts_PPLN) in Step (B15), and when the actually measured temperature value (Tm_PPLN) is not larger than the temperature setting value (Ts_PPLN), the counter is reset to zero in Step (B09). When the actually measured temperature value (Tm_PPLN) is larger than the temperature setting value (Ts_PPLN), one (1) is added to the counter in Step (B16).

In Step (B12), the numerical value of the counter and a numerical value M which is set in the control unit 21, are compared with each other, and when the numerical value of the counter is larger than M, it is judged that the laser light source apparatus is in a high temperature hang-up state where it cannot be lowered to the target temperature even if heating by the heater is lowered to the minimum, whereby the supply current to the laser is reduced by a specified value Δ IL which is preset in the control unit 21 in Step (B13). Moreover, when the numerical value of the counter is not larger than M, the processing ends at Step (B14). By repeating the series of control from Step (B02) in a state where the IR radiation heating to the wavelength conversion element (PPLN) decreases by making reduction by ΔIL, it is possible to make recovery from the high temperature hang-up state and the supply current is also stabilized at a constant value. The series of operations from Step (B01) to Step (B14) are repeated at a predetermined cycle. By performing this flow chart periodically so as to perform the feedback control, it is possible to stably perform control so that the wavelength conversion element (PPLN) becomes optimal in temperature, while avoiding a high temperature hang-up. Instead of the PI control method which is made up of proportional control and an integration element, other feedback control methods including, for example, PID control may be used.

Figure 9:
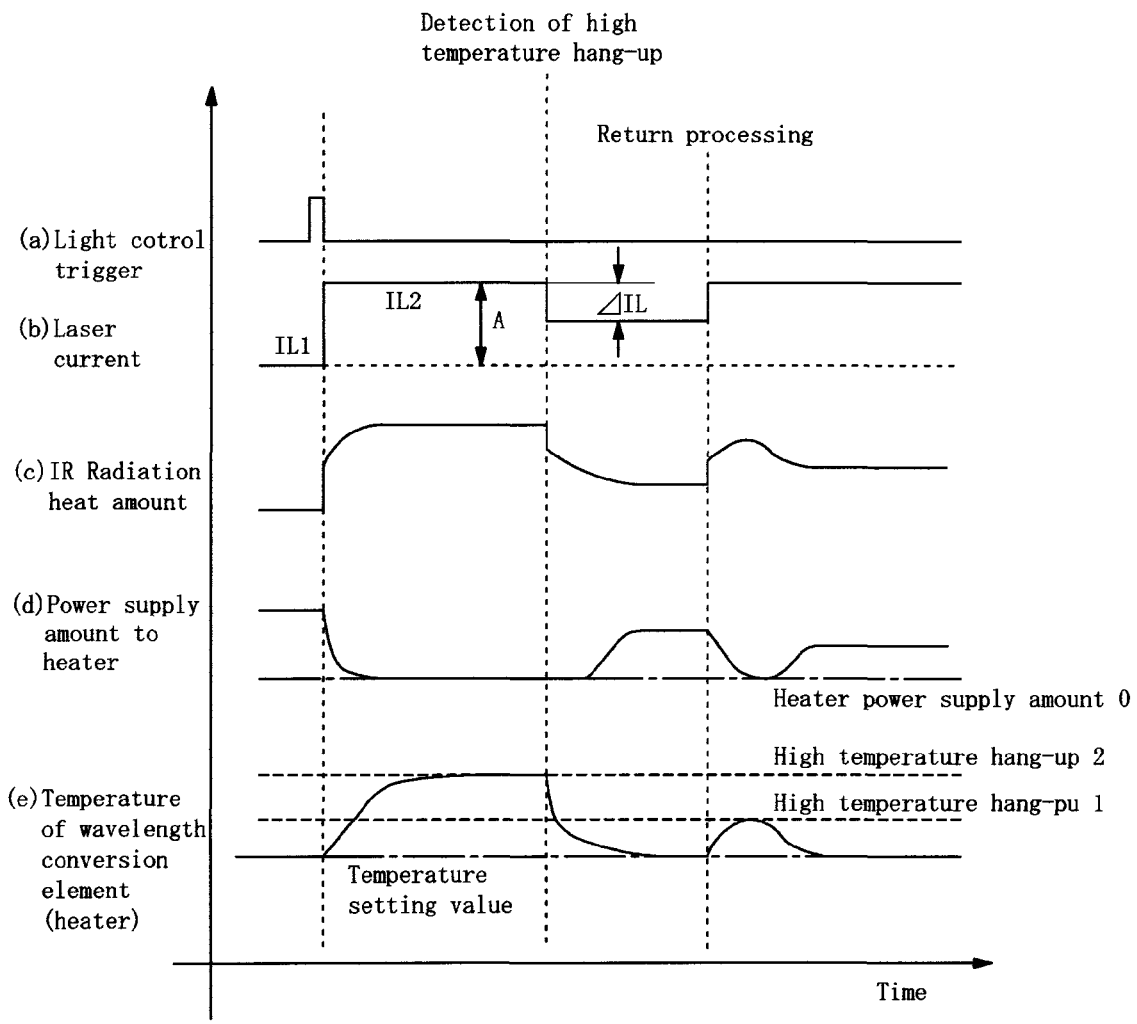
FIG. 9 is a flow chart showing an operation at time laser current is decreased so as to recover from a high temperature hang-up state when it goes into the high temperature hang-up state.

FIG. 9 is a flow chart showing an operation at time laser current is decreased so as to recover from a high temperature hang-up state when the laser light source apparatus is in the high temperature hang-up state. In the figure, (a), (b), (c), (d) and (e) respectively indicate a light control trigger, laser current of the semiconductor laser 2, IR heating amount, the amount of electric power supply to the heater 7, and the temperature of the wavelength conversion element (heater). In FIG. 9, (1) if the light control trigger is input as shown as (a) of the figure, (2) the laser current increases from IL1 to IL2 (increased amount A) as shown as (b) of the figure. (3) Simultaneously with the increase in the laser current, the amount of heating by the IR radiation which corresponds to an increased part of the laser current increases as shown as (c) of the figure. (4) As shown as (e) of the figure, with the increase in the amount of heating by IR radiation, the temperature of the wavelength conversion element 5 (temperature of the heater 7) rises. (5) When the temperature of the wavelength conversion element 5 (temperature of the heater 7) rises, and exceeds the optimal temperature of the wavelength conversion element at which the wavelength conversion efficiency turns into the maximum, the amount of heating by IR radiation further increases, and the temperature of the wavelength conversion element 5 (temperature of the heater 7) is further raised, as shown as (e) of the figure. (6) Although the amount of electric power supply to the heater 7 becomes small gradually by the feedback control of the temperature control unit 21b during the operation of the above-mentioned (3)-(5) as shown as (d) of the figure, the temperature of the wavelength conversion element 5 (temperature of the heater 7) continues to rise due to a response delay of a temperature control system, etc.

(7) When the temperature of the wavelength conversion element 5 (temperature of the heater 7) exceeds the temperature of the high temperature hang-up 1 shown as (e) in the figure, even if it stops the electric power supply to the heater, it becomes impossible to lower temperature, so that it goes into a high temperature hang-up state. And the temperature of the wavelength conversion element 5 continues to go up, and rises to the temperature of the high temperature hang-up 2. (8) As mentioned above, when a state of the minimum limit of the amount of the electric power supply to the heater continues for a predetermined time, or a state where the temperature of the wavelength conversion element is higher than a preset value continues beyond in a predetermined time, the high temperature hang-up state is detected, whereby, as shown in (b) of the figure, the laser current is reduced by a predetermined value (ΔIL). (9) As shown as (c) of the figure, the amount of heating to the wavelength conversion element by IR radiation drops, and as shown as (e) of the figure, the heater temperature (temperature of the wavelength conversion element) also begins to fall. (10) If the temperature of the wavelength conversion element falls and then falls lower than the level of the high temperature hang-up 1 shown in (e) as a dotted line of the figure, the amount of electric power supply to the heater recovers from zero level as shown as (d) of the figure. Moreover, as shown as (c) of the figure, the amount of heating to the wavelength conversion element by IR radiation falls, so that it recovers from the high temperature hang-up state. (11) If it recovers from the high temperature hang-up state, return processing is carried out. That is, the laser current is increased to IL2 which is the original level, as shown as (b) of the figure. Although the heater temperature (temperature of the wavelength conversion element) rises thereby as shown as (d) of the figure, since the increased amount of laser current is smaller than the increased amount at the time of the light control trigger, it does not exceed the level of the high temperature hang-up 1, so that the heater temperature (temperature of the wavelength conversion element) is controlled by temperature control of the temperature control unit 21*b* so as to be in agreement with the temperature setting value.

In addition, the above-mentioned return processing may be performed after a lapse of predetermined time from time when a high temperature hang-up is detected, or, may be performed when the amount of electric power supply to the heater is recovered to a predetermined value or when the temperature of the heater (temperature of the wavelength conversion element) falls to near the temperature setting value. Moreover, in the above described embodiment, an example in which the laser current is reduced by Δ IL in order to recover from the high temperature hang-up state, is shown. However, as a way of reducing the laser current value, in addition to reduction of the current value itself, for example, laser current may be turned on and off, the current value is reduced periodically, or the amount of reduction of the laser current is initially great and then is decreased with passage of time. What is necessary is just to reduce the laser current as average value. As long as the amount of heating to the wavelength conversion element by IR radiation falls substantially, any means may be used therefor.

It is desirable that a method where reduction of brightness does not get into someone's eyes, be adopted.

Moreover, the amount of laser current reduced when the above-mentioned high temperature hang-up state is detected, is made to be proportional to the increased current amount at the time the amount of current of the semiconductor laser is increased by the light control trigger, wherein when the increased amount of the laser current is large, the amount of the laser current ΔIL to be reduced is made large, and when the increased amount of the laser current is small, the laser current ΔIL to be reduced is made small. Thereby, it becomes possible to make the reduced amount of emitted light small when the increased amount of the laser current is small, so that reduction of brightness may not get into someone's eyes.

Figure 10:
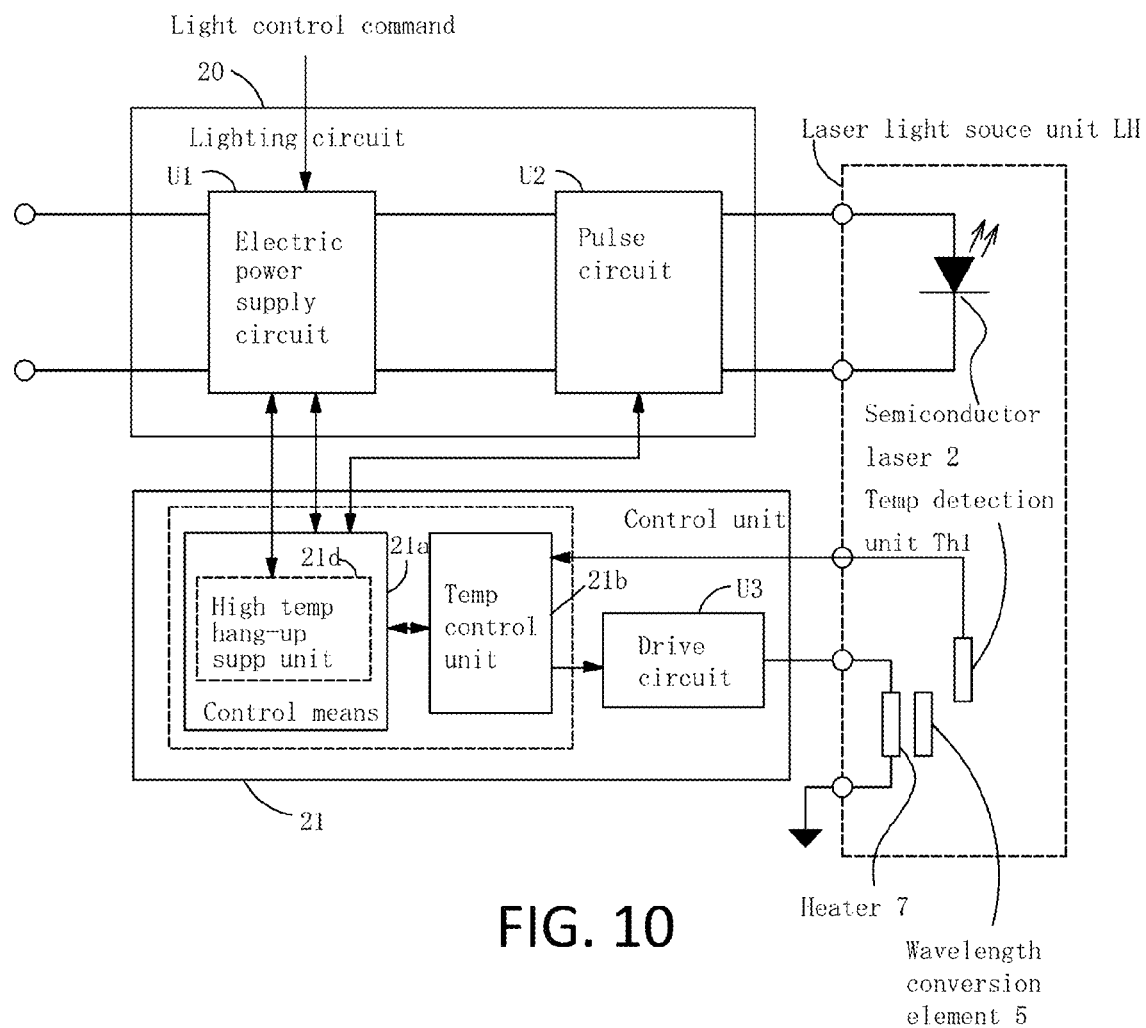
FIG. 10 is a block diagram showing a configuration of a control unit and a lightning circuit in a laser light source apparatus according to a second embodiment of the present invention.

Next, a second high temperature hang-up suppressing unit 21*d* according to a second embodiment of the present invention will be explained below. FIG. 10 is a block diagram showing the configuration of a control unit and a lightning circuit in the laser light source apparatus according to the second embodiment of the present invention. The control unit and the lightning circuit according to the present embodiment have basically the same structure as that explained in FIG. 2. The lightning circuit 20 is made up of an electric power supply circuit U1 and a pulse circuit U2 which supplies pulse-like electric power, wherein suitable voltage/current is outputted to a semiconductor laser 2 according to a state or lighting sequence of the semiconductor laser 2. Moreover, the control unit 21 comprises a control means 21*a*, a temperature control unit 21*b*, and a drive circuit U3, wherein the drive circuit U3, which drives a heater 7, is driven by an output of the temperature control unit 21*b*. The concrete configuration of the electric power supply circuit U1, the pulse circuit U2, and the drive circuit U3 etc. are the same as those explained in the FIGS. 3, 4, and 5, and further the current wave form of electric power, which is supplied to the heater 7 from the drive circuit U3, is the same as that shown in the FIG. 6.

In present embodiment, the control means 21*a* of the control unit 21 includes a high temperature hang-up suppressing unit 21*d*. As described below, if a command for increasing laser intensity is input, the high temperature hang-up suppressing unit 21*d* once stops electric power supply to the heater 7 which heats the wavelength conversion element 5, and increases the amount of electric power supply to the laser 2 by the electric power supply circuit U1 after a fixed period, so as to increase the laser intensity. Thereby, it becomes possible to suppress excessive temperature rise of the wavelength conversion element, and the high temperature hang-up.

Figure 15:
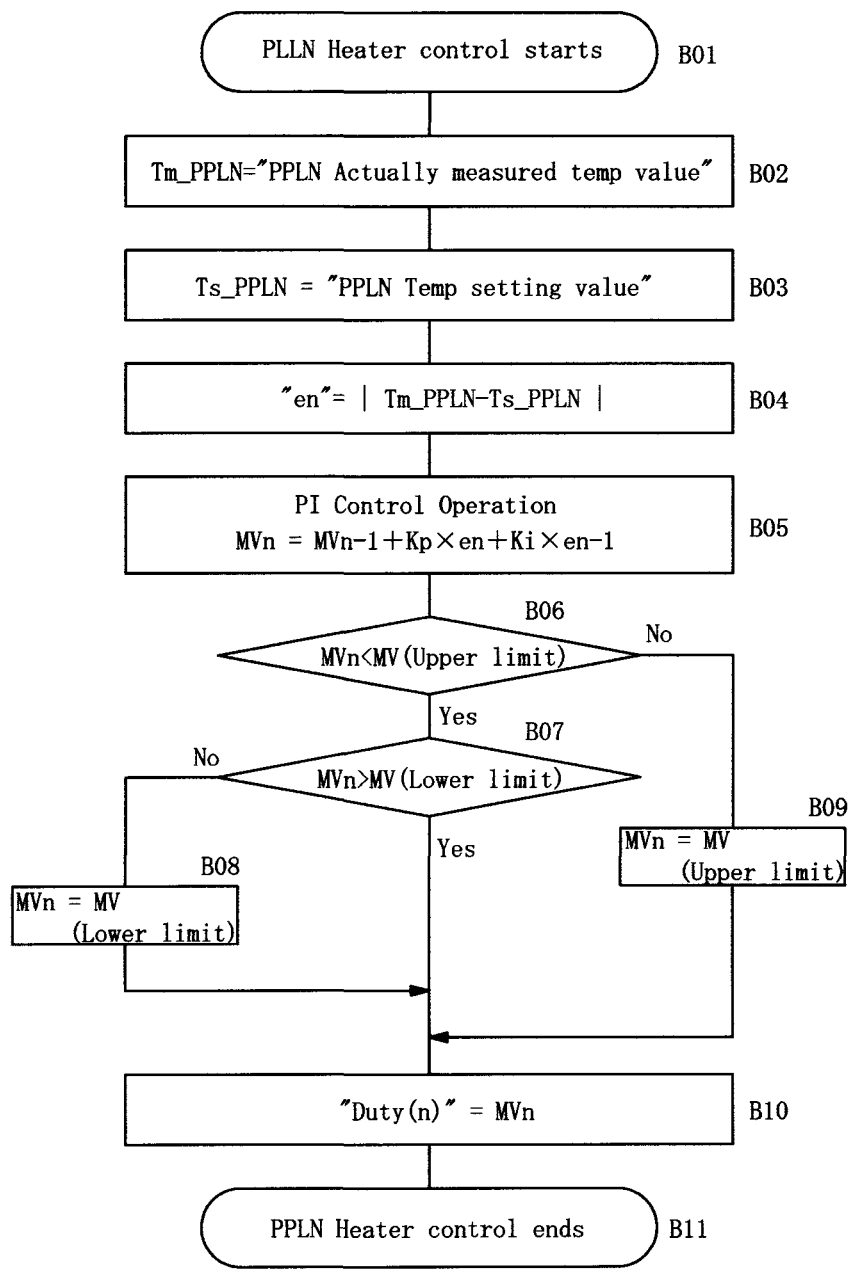
FIG. 15 is a flow chart which shows an example of control processing in a temperature control unit.
Figure 16:
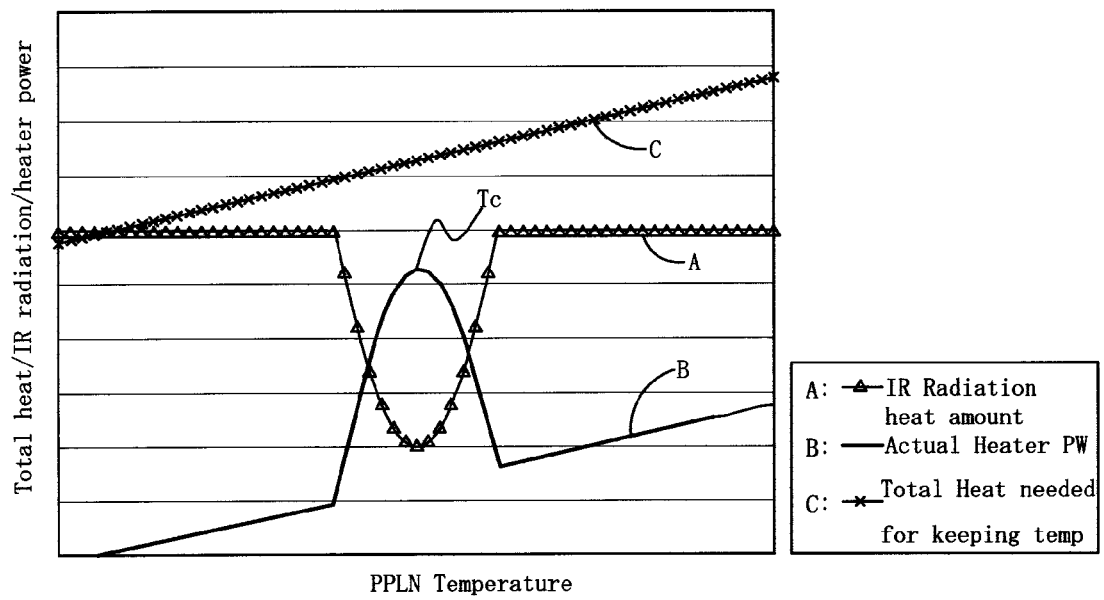
FIG. 16 is a diagram showing the relation between a preset temperature of a wavelength conversion element, and the amount of heat added to the wavelength conversion element.
Figure 16:
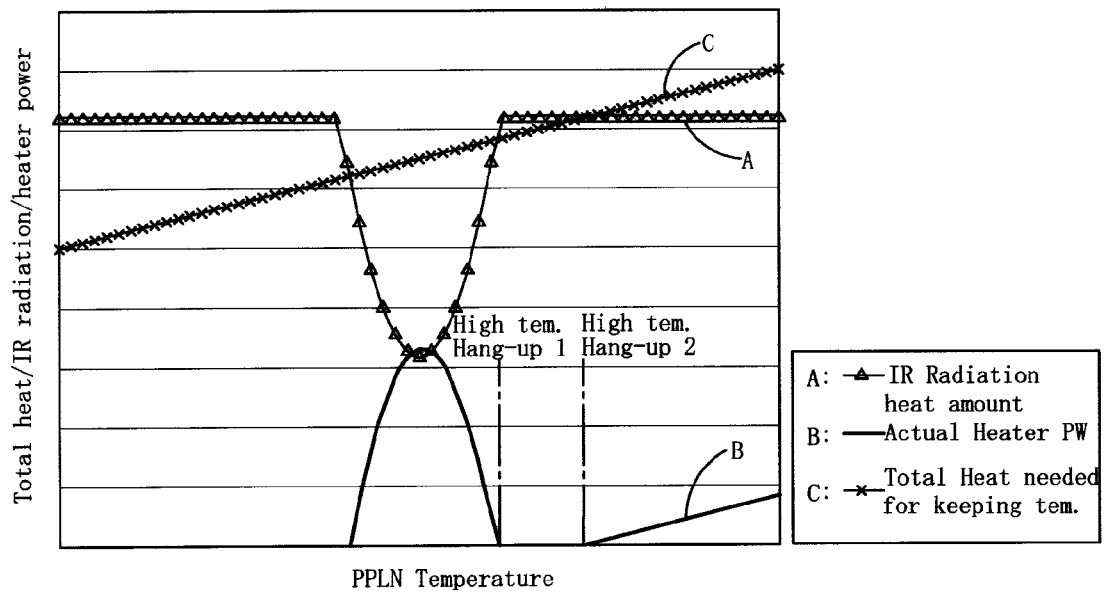
Figure 17:
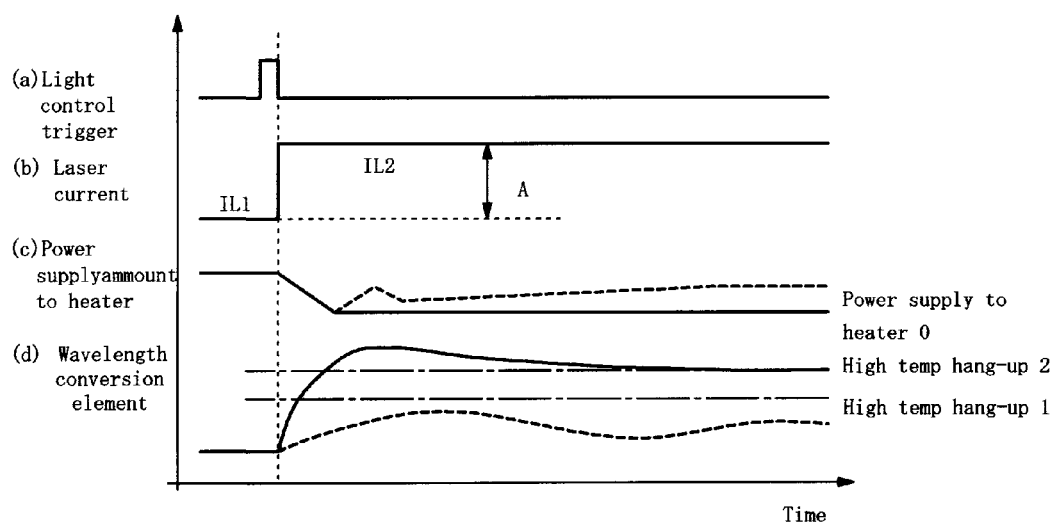
FIG. 17 is a time chart which shows an operation at time when it goes into a high temperature hang-up state.

As described above, the temperature control unit 21*b* controls the amount of electric power supply to the heater 7 based on a difference between the temperature detected by an element temperature detection unit Th1 and preset temperature, and performs control so that the temperature of the wavelength conversion element 5 turns into the preset temperature. As described above, as to a form of an electric power supply method to the heater 7, a pulse signal of the PWM signal from the temperature control unit 21*b* of the control unit 21 is sent out to a gate terminal of a switching element Q3 through a gate drive circuit G3 of the drive circuit U3, thereby controlling ON and OFF of the switching element Q3. As a result, electric power of predetermined pulse voltage is supplied to the heater 7 from a DC power supply of, for example, DC24V at a predetermined cycle. Thus, the control unit 21 stably controls the amount of electric power supply to the heater 7 so that the wavelength conversion element 5 may become the optimal temperature. The control processing in the temperature control unit 21*b* of the control unit 21 can be realized by processing of software in a microcomputer mounted in the control unit 21 as mentioned above, and the temperature control unit 21*b* of the control unit 21 performs processing shown in the flow chart in, for example, FIG. 15, and controls the temperature of the wavelength conversion element 5 to so as to turns into preset temperature.

Next, description of the high temperature hang-up suppressing unit 21*d* according to the present embodiment will be given below. As described above, when a command for increasing the laser intensity is received, without increasing the laser intensity immediately, the high temperature hang-up suppressing unit 21*d* stops electric power supply to the heater 7 which heats the wavelength conversion element 5, or reduces the amount of electric power supply so as to be a predetermined value, until a first period T2 passes from the reception of the increase command.

And after a second period T1 passes from this increase command, the amount of electric power supply to the semiconductor laser is increased.

Figure 11:
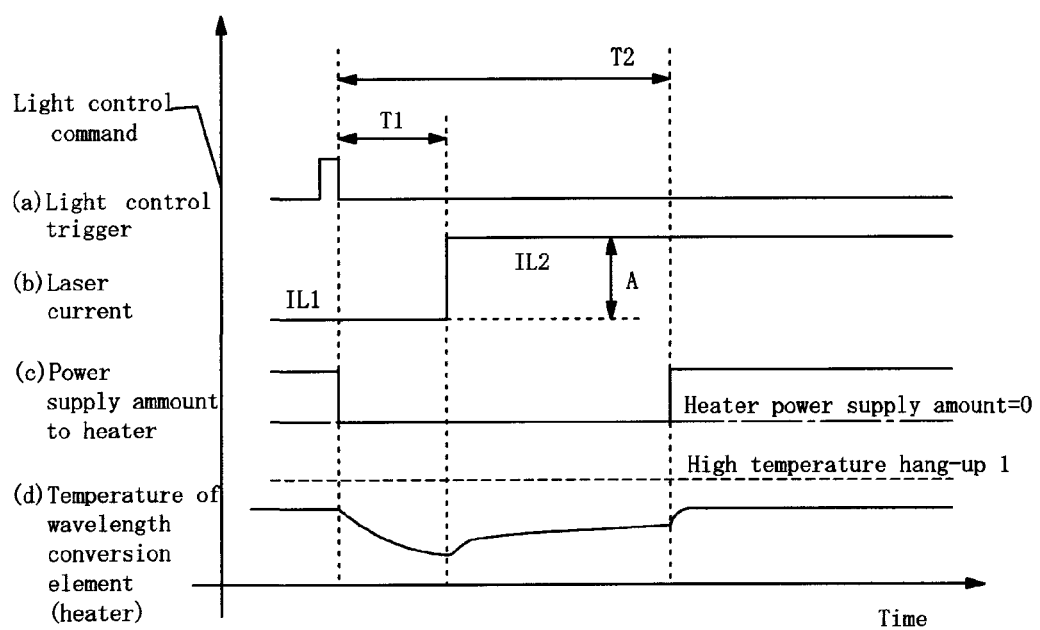
FIG. 11 is a time chart which shows change of laser current and the amount of electric power supply to a heater when a laser intensity increase command (light control command) is received in case where a hang-up suppressing unit is provided in a second embodiment.

Referring to a time chart of FIG. 11, an operation of the high temperature hang-up suppressing unit 21*d* will be described below. FIG. 11 is an operational time chart at time when there is a laser intensity increase command (light control command) in case where a hang-up suppressing unit is provided. In FIG. 11, (*a*), (*b*), (*c*), and (*d*) respectively indicate timing of a light control trigger (increase command of laser current), change in laser current, the amount of electric power supply to the heater, and the temperature of the wavelength conversion element (temperature of the heater). If there is a command (light control command) for increasing the laser intensity shown in (a) of the figure, as shown in (c) of the figure, the hang-up suppressing unit 21*d* sends out, to the drive circuit U3, a command for stopping electric power supply to the heater 7, during a period T2, thereby making the amount of electric power supply to the heater into zero level. Moreover, simultaneously therewith, as shown in (b) of the figure, it delays the laser current increase command for a period T1 to the electric power supply circuit U1 so that the laser current is held at a value of IL1. Thereby, as shown in (d) of the figure, the temperature of the heater 7 drops. If the period T1 passes after turning off the heater 7, and the temperature falls to temperature at which the temperature of the heater 7 does not go into a high temperature hang-up state even if the laser current is increased, and then the laser current is increased to IL2, as shown in (b) of the figure.

The temperature of the heater 7 (wavelength conversion element 5) increases due to the increase in the laser current as shown in (d) of the figure. And the heater 7 is again turned ON after a period T2 from time when the heater 7 is turned off. Since the temperature of the heater 7 (wavelength conversion element 5) has dropped while the heater 7 is turned off, even if the heater 7 is turned on here, it does not goes into a high temperature hang-up state, and the temperature of the heater 7 (wavelength conversion element 5) is controlled by the temperature control unit 21b, so as to be kept at the preset temperature.

Although by obtaining time periods which can suppress a high temperature hang-up by, for example, experiment etc., the periods T1 and T2 may be set up in advance to these period, they may be changed according to an amount of laser current change (increased amount). Table 1 shows values of T1 and T2 corresponding to the amount of laser current change. As shown in the table, when the amount of laser current change is small, the values of T1 and T2 are set up so as to be small to correspond thereto, and when the amount of laser current change becomes large, the values of T1 and T2 are increased according thereto. That is, since the amount of heating to the wavelength conversion element also becomes large when the amount of change of laser current is large, while a period in which the heater is turned off is made longer by such part, time to increase the laser current is delayed. By constituting in such a manner, when a light control command is received and the increased amount of the laser current is small, the laser intensity can be increased in a short delay time. In addition, although the case where T1 and T2 have relation of T1<T2 during the above-mentioned period is explained above, as long as the temperature of the wavelength conversion element is within a range where it does not go up so much (a range in which it does not go into a high temperature hang-up state), it is possible to set up the relation as T1>T2.

TABLE 1

| The amount of change of laser current | 5 | 10 | 15 | 20 |
|---|---|---|---|---|
| T1 (ms) | 50 | 100 | 200 | 150 |
| T2 (ms) | 50 | 200 | 180 | 500 |

Figure 12:
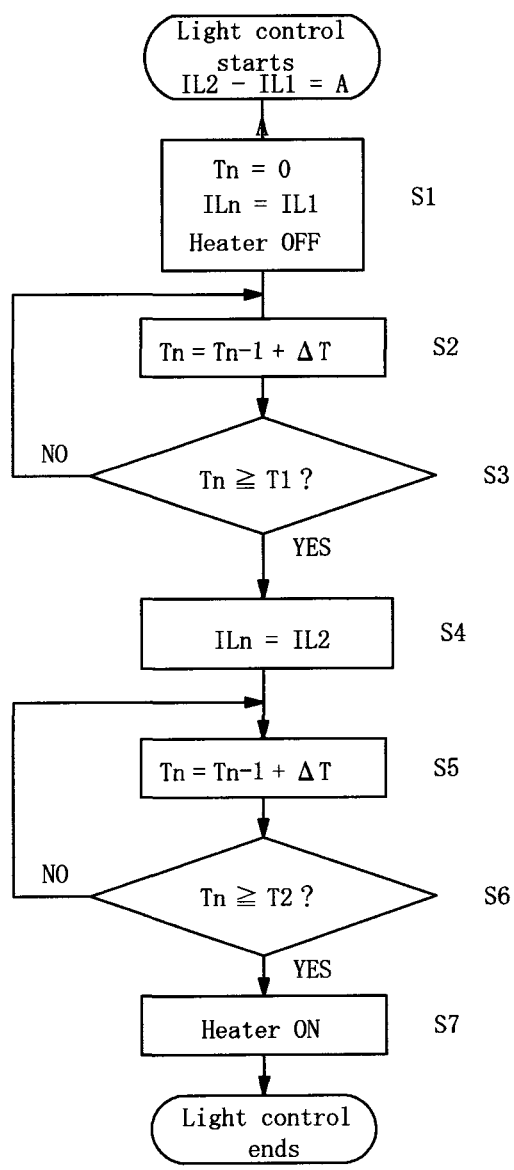
FIG. 12 is a flow chart which shows an example of control processing in a hang-up suppressing unit according to a second embodiment.

FIG. 12 is a flow chart which shows an example of control processing in the hang-up suppressing unit of the control unit 21. The flow chart of FIG. 12 can be realized by software processing in a microcomputer mounted in the control unit 21. In FIG. 12, if the light control command (laser current increased amount A) which increases laser current from $IL_1$ to $IL_2$ is given, in Step S1, settings of $T_n=0$, laser current $IL_n=IL_1$, and the heater: turned off are set up. And in Step S2, while $T_n$ is increased by $\Delta T$ ($T_n=T_{n-1}+\Delta T$), it waits until it turns into $T_n \geq T_1$ in Step S3. If it turns into $T_n \geq T_1$, while the laser current $IL_n$ is set as $IL_2$ in Step S4 and $T_n$ is increased by $\Delta T$ in Step S5 ($T_n=T_{n-1}+\Delta T$), it waits until it turns into $T_n \geq T_2$ in Step S6. If it turns into $T_n \geq T_2$, the heater is turned on in Step S7, and the processing ends.

Figure 13:
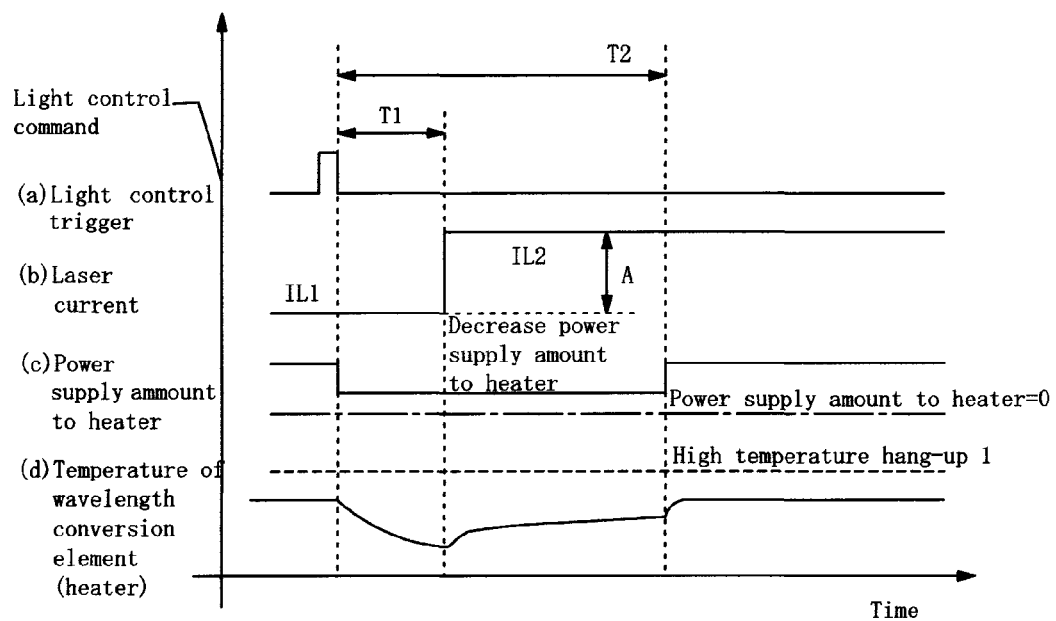
FIG. 13 is a time chart which shows change of laser current and the amount of electric power supply to a heater (the amount of electric power supply to a heater drops), etc., when a laser intensity increase command (light control command) is received in a second embodiment.
Figure 14:
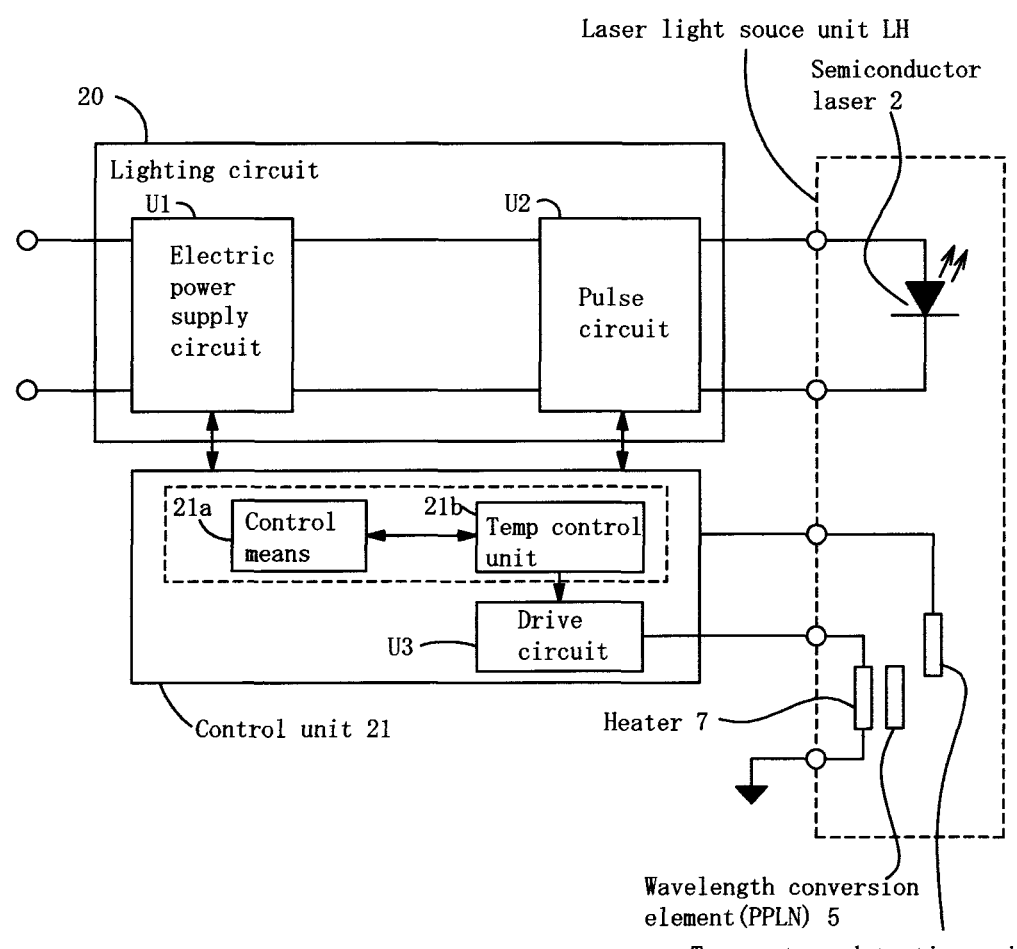
FIG. 14 is a block diagram showing a schematic structure of a laser light source apparatus.

The case where the heater 7 is turned off when there is light control command (laser current increase command) is explained above in the example shown in FIG. 11. However, as shown in FIG. 13, the amount of electric power supply to the heater 7 may be reduced, without turning off the heater 7. FIG. 13 is an operational time chart at time when a command for increasing laser light intensity (light control command) is given as in the case of FIG. 11. In FIG. 13, (a), (b), and (c) respectively indicate timing of light control command trigger (laser current increase command), change of laser current, electric power supply to the heater, and the temperature of wavelength conversion element (temperature of heater). Although the time chart of FIG. 13 is the same as that of FIG. 11, the amount of the electric power supply to the heater shown in (c) is decreased without setting to 0. In this case, it is considered that the temperature of the wavelength conversion element (heater temperature) goes up more than that in the case of FIG. 11. However, since a rise of the temperature of the wavelength conversion element (heater) is small, if it does not go up to the temperature of the high temperature hang-up 1 shown as a dotted line of the figure, it is possible to suppress a high temperature hang-up state as in the case of FIG. 11.

The preceding description has been presented only to illustrate and describe exemplary embodiments of the present laser light source apparatus. It is not intended to be exhaustive or to limit the invention to any precise form disclosed. It will be understood by those skilled in the art that various changes may be made and equivalents may be substituted for elements thereof without departing from the scope of the invention. In addition, many modifications may be made to adapt a particular situation or material to the teachings of the invention without departing from the essential scope. Therefore, it is intended that the invention not be limited to the particular embodiment disclosed as the best mode contemplated for carrying out this invention, but that the invention will include all embodiments falling within the scope of the claims. The invention may be practiced otherwise than is specifically explained and illustrated without departing from its spirit or scope.

What is claimed is:

1. A laser light source apparatus, comprising:
   a semiconductor laser;
   a wavelength conversion element which carries out wavelength conversion of laser light emitted from the semiconductor laser;
   a heater which heats the wavelength conversion element;
   an electric power supply circuit which supplies electric power to the semiconductor laser;
   a heater electric power supply circuit which supplies electric power to the heater;
   a temperature control unit which detects the temperature of the wavelength conversion element, controls the amount of electric power supply to the heater, and controls the temperature of the wavelength conversion element to turn into target temperature, and
   a control unit which controls the heater electric power supply circuit and the electric power supply circuit which supplies electric power to the semiconductor laser,
   wherein the control unit is provided with a high temperature hang-up suppressing unit which suppresses a high temperature hang-up state where the temperature of the wavelength conversion element cannot be controlled even if the amount of electric power supply to the heater is reduced in a temperature region higher than the temperature at which the conversion efficiency of the wavelength conversion element turns into the maximum, by decreasing electric power supply to the semiconductor laser by a predetermined amount, when the high temperature hang-up state occurs.

2. The laser light source apparatus according to claim 1, wherein the high temperature hang-up suppressing unit decreases electric power supply to the semiconductor laser by a predetermined amount, when the amount of electric power supply to the heater by the temperature control unit is the predetermined lower limit or below for a predetermined period or longer, which is regarded as occurrence of the high temperature hang-up state.

3. The laser light source apparatus according to claim 1, wherein the high temperature hang-up suppressing unit decreases electric power supply to the semiconductor laser by a predetermined amount when the temperature of the wavelength conversion element is higher than the target temperature by a predetermined constant temperature or more for a predetermined period or longer, which is regarded as occurrence of a high temperature hang-up state.

4. The laser light source apparatus according to claim 1, wherein the high temperature hang-up suppressing unit decreases electric power supply to the semiconductor laser by an amount proportional to an increased amount of electric power supply to the semiconductor laser when a high temperature hang-up state arises due to an increase of electric power supply to the semiconductor laser.

5. The laser light source apparatus according to claim 1, wherein periodically poled lithium niobate is used as the wavelength conversion element.

6. A laser light source apparatus, comprising:
a semiconductor laser;
a wavelength conversion element which carries out wavelength conversion of laser light emitted from the semiconductor laser;
a heater which heats the wavelength conversion element;
an electric power supply circuit which supplies electric power to the semiconductor laser;
a heater electric power supply circuit for supplies electric power to the heater;
a temperature control unit which detects the temperature of the wavelength conversion element, controls the amount of electric power supply to the heater, and controls the temperature of the wavelength conversion element to turns into a desired temperature;
a control unit which controls the heater electric power supply circuit and the electric power supply circuit which supplies electric power to the semiconductor laser,
wherein the control unit is provided with a high temperature hang-up suppressing unit which suppress this high temperature hang-up when a high temperature hang-up state occurs where the temperature of the wavelength conversion element cannot be controlled even if the amount of electric power supply to the heater is reduced in a temperature region higher than the temperature at which the conversion efficiency of the wavelength conversion element turns into the maximum, and
wherein in response to an increase command of the amount of electric power supply to the semiconductor laser, the second hang-up suppressing unit stops the electric power supply to the heater or decreases the amount of electric power supply so as to be a predetermined value until a first period T2 passes from the increase command, and increases the amount of electric power supply to the semiconductor laser after a second period T1 passes from the increase command.

7. The laser light source apparatus according to claim 6, wherein the high temperature hang-up suppressing unit changes a length of the first period T2 according to the increased amount of electric power supply to the semiconductor laser in the increase command.

8. The laser light source apparatus according to claim 7, wherein the high temperature hang-up suppressing unit changes a length of the second period T1 according to the increased amount of electric power supply to the semiconductor laser in the increase command.

9. The laser light source apparatus according to claim 6, wherein the wavelength conversion element is made of periodically poled lithium niobate.

* * * * *